(12) United States Patent
Johnson et al.

(10) Patent No.: US 7,071,498 B2
(45) Date of Patent: Jul. 4, 2006

(54) GALLIUM NITRIDE MATERIAL DEVICES INCLUDING AN ELECTRODE-DEFINING LAYER AND METHODS OF FORMING THE SAME

(75) Inventors: Jerry W. Johnson, Raleigh, NC (US); Robert J. Therrien, Apex, NC (US); Andrei Vescan, Aachen, NC (US); Jeffrey D. Brown, Garner, NC (US)

(73) Assignee: Nitronex Corporation, Releigh, NC (US)

( * ) Notice: Subject to any disclaimer, the term of this patent is extended or adjusted under 35 U.S.C. 154(b) by 0 days.

(21) Appl. No.: 10/740,376

(22) Filed: Dec. 17, 2003

(65) Prior Publication Data

US 2005/0133818 A1    Jun. 23, 2005

(51) Int. Cl.
*H01L 31/072*  (2006.01)
*H01L 31/109*  (2006.01)
*H01L 31/0328* (2006.01)
*H01L 31/0336* (2006.01)
*H01L 29/80*   (2006.01)

(52) U.S. Cl. .............. 257/192; 257/109; 257/155; 257/194; 257/280

(58) Field of Classification Search ........ 257/192–194, 257/382–410, 109, 155, 280
See application file for complete search history.

(56) References Cited

U.S. PATENT DOCUMENTS

| | | | |
|---|---|---|---|
| 4,843,440 A | 6/1989 | Huang | |
| 4,865,952 A | 9/1989 | Yoshioka et al. | |
| 5,192,987 A | 3/1993 | Khan et al. | |
| 5,239,188 A | 8/1993 | Takeuchi et al. | |
| 5,290,393 A | 3/1994 | Nakamura | |
| 5,296,395 A | 3/1994 | Khan et al. | |
| 5,389,571 A | 2/1995 | Takeuchi et al. | |
| 5,393,993 A | 2/1995 | Edmond et al. | |
| 5,448,086 A * | 9/1995 | Hida | 257/194 |
| 5,523,589 A | 6/1996 | Edmond et al. | |
| 5,633,192 A | 5/1997 | Moustakas et al. | |
| 5,679,965 A | 10/1997 | Schetzina | |
| 5,739,554 A | 4/1998 | Edmond et al. | |
| 5,741,724 A | 4/1998 | Ramdani et al. | |
| 5,760,426 A | 6/1998 | Marx et al. | |
| 5,786,606 A | 7/1998 | Nishio et al. | |
| 5,815,520 A | 9/1998 | Furushima | |
| 5,838,029 A | 11/1998 | Shakuda | |

(Continued)

FOREIGN PATENT DOCUMENTS

JP        2001 085670 A        3/2001

(Continued)

OTHER PUBLICATIONS

Ando, Y. et al., "10-W/mm AlGaN-GaN HFET With a Field Modulating Plate," IEEE Electron Device Lett. 24(5):289 (2003).

(Continued)

*Primary Examiner*—Cuong Nguyen
(74) *Attorney, Agent, or Firm*—Wolf, Greenfield & Sacks, P.C.

(57) ABSTRACT

Gallium nitride material devices and methods of forming the same are provided. The devices include an electrode-defining layer. The electrode-defining layer typically has a via formed therein in which an electrode is formed (at least in part). Thus, the via defines (at least in part) dimensions of the electrode. In some cases, the electrode-defining layer is a passivating layer that is formed on a gallium nitride material region.

72 Claims, 15 Drawing Sheets

U.S. PATENT DOCUMENTS

| | | | |
|---|---|---|---|
| 5,838,706 | A | 11/1998 | Edmond et al. |
| 5,874,747 | A | 2/1999 | Redwing et al. |
| 5,915,164 | A * | 6/1999 | Taskar et al. ............ 438/47 |
| 5,929,467 | A | 7/1999 | Kawai et al. |
| 5,994,753 | A | 11/1999 | Nitta |
| 6,051,849 | A | 4/2000 | Davis et al. |
| 6,064,078 | A | 5/2000 | Northrup et al. |
| 6,064,082 | A | 5/2000 | Kawai et al. |
| 6,069,021 | A | 5/2000 | Terashima et al. |
| 6,100,545 | A | 8/2000 | Chiyo et al. |
| 6,120,600 | A | 9/2000 | Edmond et al. |
| 6,121,121 | A | 9/2000 | Koide |
| 6,139,628 | A | 10/2000 | Yuri et al. |
| 6,140,169 | A * | 10/2000 | Kawai et al. ............ 438/197 |
| 6,146,457 | A | 11/2000 | Solomon |
| 6,153,010 | A | 11/2000 | Kiyoku et al. |
| 6,156,581 | A | 12/2000 | Vaudo et al. |
| 6,177,688 | B1 | 1/2001 | Linthicum et al. |
| 6,180,270 | B1 | 1/2001 | Cole et al. |
| 6,201,262 | B1 | 3/2001 | Edmond et al. |
| 6,255,198 | B1 | 7/2001 | Linthicum et al. |
| 6,261,929 | B1 | 7/2001 | Gehrke et al. |
| 6,261,931 | B1 | 7/2001 | Keller et al. |
| 6,265,289 | B1 | 7/2001 | Zheleva et al. |
| 6,291,319 | B1 | 9/2001 | Yu et al. |
| 6,329,063 | B1 | 12/2001 | Lo et al. |
| 6,380,108 | B1 | 4/2002 | Linthicum et al. |
| 6,391,748 | B1 | 5/2002 | Temkin et al. |
| 6,403,451 | B1 | 6/2002 | Linthicum et al. |
| 6,406,965 | B1 | 6/2002 | Lammert |
| 6,420,197 | B1 | 7/2002 | Ishida et al. |
| 6,426,512 | B1 | 7/2002 | Ito et al. |
| 6,440,823 | B1 | 8/2002 | Vaudo et al. |
| 6,441,393 | B1 | 8/2002 | Goetz et al. |
| 6,459,712 | B1 | 10/2002 | Tanaka et al. |
| 6,465,814 | B1 | 10/2002 | Kasahara et al. |
| 6,486,502 | B1 | 11/2002 | Sheppard et al. |
| 6,498,111 | B1 | 12/2002 | Kapolnek et al. |
| 6,521,514 | B1 | 2/2003 | Gehrke et al. |
| 6,521,961 | B1 * | 2/2003 | Costa et al. ............ 257/402 |
| 6,524,932 | B1 | 2/2003 | Zhang et al. |
| 6,548,333 | B1 | 4/2003 | Smith |
| 6,583,034 | B1 | 6/2003 | Ramdani et al. |
| 6,583,454 | B1 | 6/2003 | Sheppard et al. |
| 6,586,781 | B1 | 7/2003 | Wu et al. |
| 6,610,144 | B1 | 8/2003 | Mishra et al. |
| 6,611,002 | B1 | 8/2003 | Weeks et al. |
| 6,617,060 | B1 | 9/2003 | Weeks, Jr. et al. |
| 6,624,452 | B1 | 9/2003 | Yu et al. |
| 6,649,287 | B1 | 11/2003 | Weeks, Jr. et al. |
| 6,765,240 | B1 | 7/2004 | Tischler et al. |
| 6,765,241 | B1 | 7/2004 | Ohno et al. |
| 6,777,278 | B1 | 8/2004 | Smith |
| 6,841,409 | B1 | 1/2005 | Onishi |
| 2001/0042503 | A1 | 11/2001 | Lo et al. |
| 2002/0020341 | A1 | 2/2002 | Marchand et al. |
| 2002/0117681 | A1 | 8/2002 | Weeks et al. |
| 2002/0117695 | A1 | 8/2002 | Borges |
| 2002/0167023 | A1 | 11/2002 | Chavarkar et al. |
| 2003/0136333 | A1 | 7/2003 | Semond et al. |

FOREIGN PATENT DOCUMENTS

| | | |
|---|---|---|
| WO | WO 96/41906 | 12/1996 |
| WO | WO 01/13436 A1 | 2/2001 |

OTHER PUBLICATIONS

Ando, Y. et al.m "A 110-W AlIGaN/GaN Heterojunction FET On Thinned Sapphire Substrate," Photonic and Wireless Devices Research Labs, NEC Corp. (2001).

Binari, S.C. et al., "Microwave Performance of GaN MESFETs," Electronics Lett. 30(15):1248 (1994).

Bindra, A., "Exotic Materials Squeeze More Juice Out of RF Power Amplifiers," www.elecdesign.com, ED Online ID #2367, Jun. 24, 2002.

Borges, R. et al., "GaN HFETs on Silicon Target Wireless Infrastructure Market," Compund Semiconductor, p. 2 (Aug. 2003).

Brown, J.D. et al., "AlGaN/GaN HFETs Fabricated on 100-mm GaN on Silicon (111) Substrates," Solid-State Electronics 46:1535 (2002).

Brown, J.D. et al "Peformance of AlGaN/GaN HFETs Fabricated on 100mm Silicon Substrates for Wireless Basestation Applications," Nitronex Corporation, IEEE MTT-S Digest p.833 (2004).

Chen, P. et al., "Growth of High Quality GaN Layers With AlN Buffer on Si(111) SUbstrates," J. Crystal Growth.

Chumbes, E. et al., "AlGaN/GaN High Electron Mobility Transistors on Si(111) Substrates," IEEE Trans. Electron Dev. 48(3):420 (2001).

Dadgar, A. et al., "Bright, Crack-Free InGaN/GaN Light Emitters on Si(111)," Phys. Stat. Sol. 192(2):308 (2002).

Dadgar, A. et al., "Metalorganic Chemical Vapor Phase Epitaxy of Crack-Free GaN on Si(111) Exceeding 1 μm in Thickness," Jp. J. Appl. Phys. 39:L1883 (2000).

Dadgar, A. et al., "MOVPE Growth of GaN on Si(111) Substrates," J. Crystal Growth 248:556 (2003).

Elhamri, S. et al., "An ELectrical Characterization of a Two Dimensional Electron Gas in GaN/AlGaN on Silicon Substrates," J. Appl. Phys. 95(12):7982 (2004).

Fanning, D. et al., "Dielectrically Defined Optical T-Gate for High Power GaAs pHEMTs," GaAsMANTECH Conference (2002).

Guha, S. et al., "Ultraviolet and Violet GaN Light Emitting Diodes on Silicon," Appl. Phys. Lett. 72(4):415 (1998).

Hageman, P.R. et al., "High Quality GaN Layers on Si(111) Substrates: AlN Buffer Laer Optimisation and Insertion of a SiN Layer," Phys. Stat. Sol. 188(2):523 (2001).

Hanington, G. et al., "P/He Ion Implant Isolation Technology for AlGaN/GaN HFETs," Electronics Lett. 34(2):193 (1998).

Hanson, A. W. et al., "Development of a GaN Transistor Process for Linear Power Applications," Nitronex Corporation Paper presented at the 2004 International Conference on Compound Semiconductor Manufacturing Technology (GaAs MANTECH), Miami, Fl.

Hirosawa, K. et al., "Growth of Single Crystal $Al_2Ga_{1-a}N$ Films on Si. SUbstrates by Metalorganis Vapor Phase Epitaxy," Jpn. J. Appl. Phys. 32:L1039 (1993).

Ishikawa, H. et al., "High-Quality GaN on Si Substrate Using AlGaN/ AlN Intermediate Layer," Phys. Stat. Sol. 176:599 (1999).

Johnson, J. W. et al., "12 W/mm AlGaN-GaN HFETs on Silicon Substrates," IEEE Electron Device Let. 25(7):459 (2004).

Johnson, J. W. et al., "$GD_2O_3$/GaN Metal-Oxide-Semiconductor Field-Effect Transistor," Appl. Phys. Lett. 77(20):3230 (2000).

Johnson, J. W. et al., "Material, Process, and Device Development of GaN-Based HFETs on Silicon Substrates," Nitronex Corporation, Electrochemical Society Proceedings 2004-06, 405 (2004).

Joshin, K. et al., "A 174 W High-Efficiency GaN HEMT Power Amplifier for W-CDMA Base Station Applications," Fujitsu Laboratories Ltd. (2003).

Kang, B.S. et al., "Pressure-Induced Changes in the Conductivity of AlGaN/GaN High-Electron Mobility-Transistor Membranes," Appl. Phys. Lett. 85(14):2962 (2004).

Kikkawa, T. et al., "An Over 200-W Output Power GaN HEMT Push-Pull Amplifier with High Reliability," IEEE MTT-S Digest (2004).

Lahreche, H. et al., "Optimisation of AlN and GaN Growth by Metalorganic Vapour-Phase Epitaxy (MOVPE) on Si(111)," J. Crystal Growth 217:13 (2000).

Lee, I. et al., "Growth and Optical Properties of GaN on Si(111) Substrates," J. Crystal Growth 235:73 (2002).

Lei, T. et al., "Epitaxial Growth of Zinc Blende and Wurtzitic Gallium Nitride Thin FIlms on (001) Silicon," Appl. Phys. Lett. 59(8):944 (1991).

Liu, R. et al., "Atomic Arrangement at the AlN/Si (111) Interface," Appl. Phys. Lett. 83(5):860 (2003).

Moser, N.A. et al., "Effects of Surface Treatments on Isolation Currents in AlGaN/GaN High-Electron-Mobility Transistors," Appl. Phys. Lett. 83(20);4178 (2003).

Nagy, W. et al., "Linearity Characteristics of Microwave Power GaN HEMTs," IEEE Transactions on Microwave Theory & Techniques 51(2):1 (2003).

Nakada, Y. et al., "GaN Heteroepitaxial Growth on ilicon Nitride Buffer Layers Formed on Si (111) Surfaces by Plasma-Assisted Molecular Beam Epitaxy," Appl. Phys. Lett. 73(6):827 (1998).

Newey, J., "GaN: Ready for Celllular 3G?," Compound Semiconductor, p.21 (Jan./Feb. 2004).

Nikishin, S.A. et al., "High Quality GaN Grown on Si(111) by Gas Source Molecular Beam Epitaxy with Ammonia," Appl. Phys. Lett. 75(14):2073 (1999).

Nuttinck, S. et al., "Direct On-Wafer Non-Invasive Thermal Monitoring of AlGaN/GaN Power HFETs Under Microwave Large Signal Conditions," Paper Presented at European Microwave Week, Amsterdam, NL (2004).

Ohtani, A. et al., "Microstructure and Photoluminescence of GaN Grown on Si(111) by Plasma-Assisted Molecular Beam Epitaxy," Appl. Phys. Lett. 65(1):61 (1994).

Okamoto, Y. et al., "An 80W AlGaN/GaN Heterojunction FET With a Field-Modulating Plate," IEEE MTT-S Digest p.225 (2003).

Osinsky, A. et al., "Visible-Blind GaN Schottky Barrier Detectors Grown on Si(111)," Appl. Phys. Lett. 72(5):551 (1998).

Palmour, J. W. et al., "Wide Bandgap Semiconductor Devices and MMICs for RF Power Applications," IEEE (2001).

Patel, S., "The Bottleneck on the Road to 3G," WirelessFuture Magazine (Jan./Feb. 2003).

Piner, E., "GaN Transistors and Power Amplifiers Close in on Commercialization," Compound Semiconductor (Jul. 2004).

Rajagopal, P. et al., "Large-Area, Device Quality GaN on Si Using a Novel Transition Layer Scheme," Nitronex Corporation, Material research Society Symposium Proceedings 743(3) (2003).

Rajagopal, P. et al., "MOVCD AlGaN/GaN HFETs on Si: Challenges and Issues," Symposium y: GAN and Related Alloys, Nitronex Corporation, Material Research Society Symposium Proceedings, 798, 61-66 (2004).

Reitmeier, Z. et al., "Growth and Characterization of AlN and GaN Thin Films Deposited on Si(111) Substrates Containing a Very Thin Al Layer," Dept. Materials Science & Engineering, NC State University.

Semond, F. et al., "GaN Grown on Si(111) Substrate: From Two-Dimendional Growth to Quantum Well Assessment," Appl. Phys. Lett. 75(1):82 (1999).

Singhal, S. et al., "Gallium Nitride on Silicon HEMTs for Wireless Infrastructure Applications, Thermal Design and Performance," Nitronex Corporation, Paper presented at the European Microwave Week, Milan, Italy (2002).

Tanaka, S. et al., "Defect Structure in Selective Area Growth GaN Pyramid on (111) Si Substrate," Appl. Phys. Lett. 76(19):2701 (2000).

Thompson, R. et al., "improved Fabrication Process for Obtaining High Power Density AlGaN/GaN HEMTs," IEEE GaAs Digest p.298 (2003).

Vescan, A. et al., "AlGaN/GaN HFETs on 100 mm Silicon Substrates for Commercial Wireless Applications," Phys. Stat. Sol. (c) 0(1):52 (2002).

Zhao, Z.M. et al., "Metal-Semiconductor-Metal GaN Ultraviolet Photodetectors on Si(111)," Appl. Phys. Lett. 77(3):444 (2000).

Atkinson, G.M. et al., "Self-Aligned High Electron Mobility Transistor Gate Fabrication Using Ion Beams," J. Vac. Sci. Technol. B 9(6):3506 (1991).

International Search Report, from PCT/US2004/042260, mailed May 6, 2005.

Wrriten Opinion, from PCT/US2004/042260, mailed May 6, 2005.

* cited by examiner

GALLIUM NITRIDE MATERIAL DEVICES INCLUDING AN ELECTRODE-DEFINING LAYER AND METHODS OF FORMING THE SAME

FIELD OF INVENTION

The invention relates generally to gallium nitride materials and, more particularly, to gallium nitride material devices including an electrode-defining layer and methods of forming the same.

BACKGROUND OF INVENTION

Gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Gallium nitride materials have a number of attractive properties including high electron mobility, the ability to efficiently emit blue light, the ability to transmit signals at high frequency, and others. Accordingly, gallium nitride materials are being widely investigated in many microelectronic applications such as transistors, field emitters, and optoelectronic devices.

SUMMARY OF INVENTION

The invention provides gallium nitride material devices including an electrode-defining layer and methods of forming the same.

In one embodiment, a semiconductor structure is provided. The structure comprises a gallium nitride material region and an electrode-defining layer formed over the gallium nitride material region. The electrode-defining layer includes a via formed therein. A cross-sectional area at a top of the via is greater than a cross-sectional area at a bottom of the via. The structure further comprises an electrode formed on the gallium nitride material region and in the via, wherein the electrode length is defined at the bottom of the via.

In another embodiment, a transistor is provided. The transistor comprises a gallium nitride material region and an electrode-defining layer formed on the gallium nitride material region. The electrode-defining layer includes a via formed therein. A cross-sectional area of the via is greater at a top of the via than at a bottom of the via. A sidewall of the via extends upward from the bottom of the via at an angle between about 5 degrees and about 85 degrees and downward from the top of the via at an angle between about 90 degrees and about 160 degrees. The transistor further comprises a source electrode formed on the gallium nitride material region, a drain electrode formed on the gallium nitride material region; and a gate electrode formed on the gallium nitride material region and in the via. A length of the gate electrode is defined at the bottom of the via and the ratio of the gate electrode length to a cross-sectional dimension at the top of the via is between about 0.50 and 0.95.

In another embodiment, a Schottky diode is provided. The Schottky diode comprises a gallium nitride material region and an electrode-defining layer formed over the gallium nitride material region. The electrode-defining layer includes a via formed therein. A cross-sectional area at a top of the via is greater than a cross-sectional area at a bottom of the via. A sidewall of the via extends upward from the bottom of the via at an angle between about 5 degrees and about 85 degrees and downward from the top of the via at an angle between about 90 degrees and about 160 degrees. The Schottky diode further comprises a Schottky electrode formed on the gallium nitride material region and in the via, wherein the electrode length is defined at the bottom of the via. The Schottky diode further comprises an ohmic electrode formed on the gallium nitride material region.

In another embodiment, a method of forming a semiconductor structure is provided. The method comprises forming an electrode-defining layer on a gallium nitride material region and forming a via in the electrode-defining layer such that a cross-sectional dimension at a top of the via is greater than a cross-sectional dimension at a bottom of the via. The method further comprises forming an electrode on the gallium nitride material region and in the via, wherein a length of the electrode is defined by the bottom of the via.

In another embodiment, a method of forming a transistor is provided. The method comprises forming an electrode-defining layer on a gallium nitride material region and forming a via in the electrode-defining layer. A cross-sectional dimension at a top of the via is greater than a cross-sectional dimension at a bottom of the via and a sidewall of the via extends upward from the bottom of the via at an angle between about 5 degrees and about 85 degrees and downward from the top of the via at an angle between about 90 degrees and about 160 degrees. The method further comprises forming a source electrode on the gallium nitride material region, forming a drain electrode on the gallium nitride material region, and forming a gate electrode on the gallium nitride material region and in the via. A length of the gate electrode is defined at the bottom of the via and the ratio of the gate electrode length to a cross-sectional dimension at the top of the via is between about 0.50 and 0.95.

In another embodiment, a method of forming a Schottky diode is provided. The method comprises forming an electrode-defining layer on a gallium nitride material region and forming a via in the electrode-defining layer. A cross-sectional dimension at a top of the via is greater than a cross-sectional dimension at a bottom of the via. A sidewall of the via extends upward from the bottom of the via at an angle between about 5 degrees and about 85 degrees and downward from the top of the via at an angle between about 90 degrees and about 160 degrees. The method further comprises forming an ohmic electrode on the gallium nitride material region and forming a Schottky electrode on the gallium nitride material region and in the via, wherein the electrode length is defined at the bottom of the via.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The invention provides gallium nitride material devices and methods of forming the same. The devices include an electrode-defining layer. The electrode-defining layer typically has a via formed therein in which an electrode is formed (at least in part). Thus, the via defines (at least in part) dimensions of the electrode. In some cases, the electrode-defining layer is a passivating layer that is formed on a gallium nitride material region.

Figure 1A:
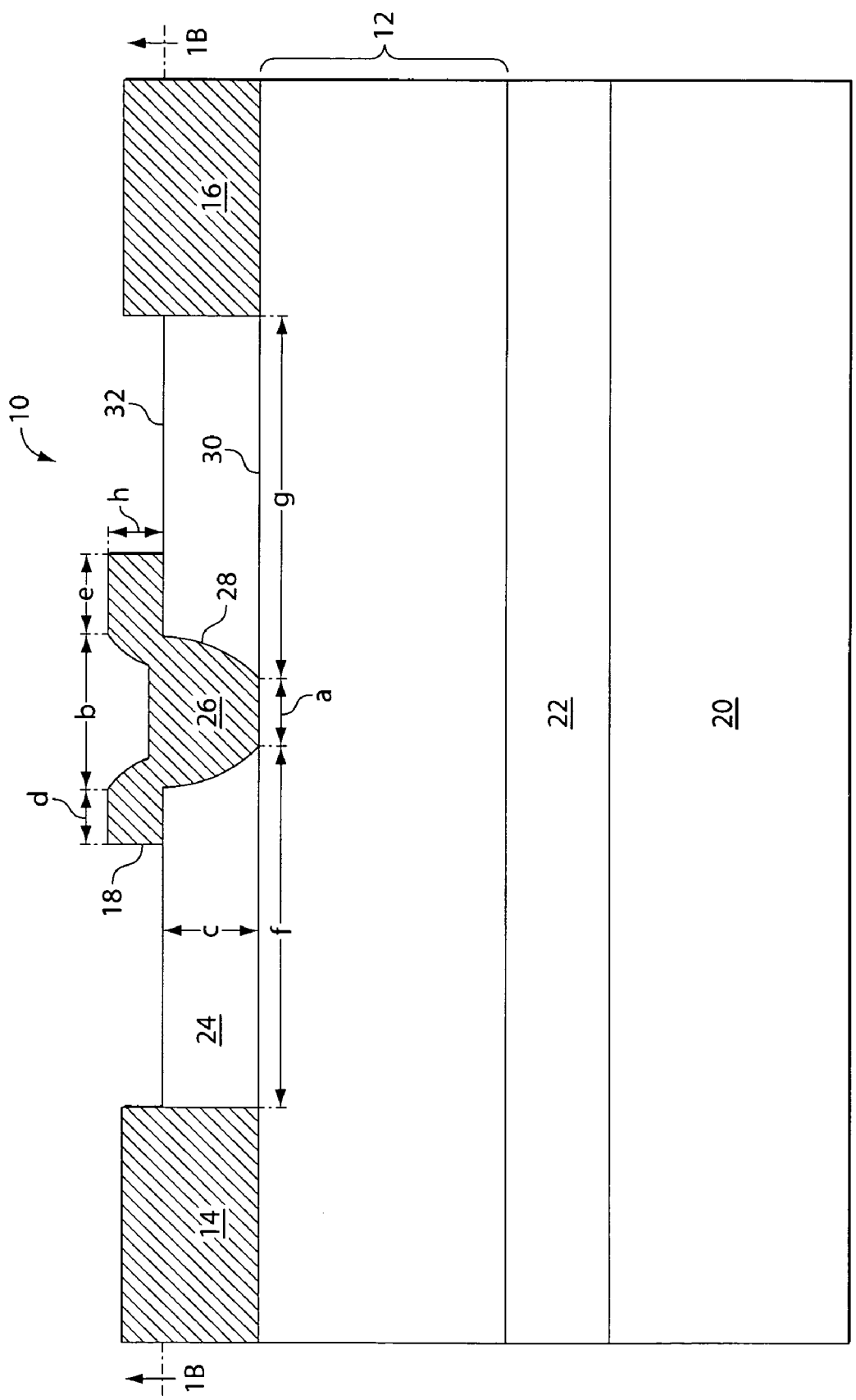
FIG. 1A is a cross-section of a gallium nitride material device including an electrode-defining layer according to an embodiment of the invention.
Figure 1B:
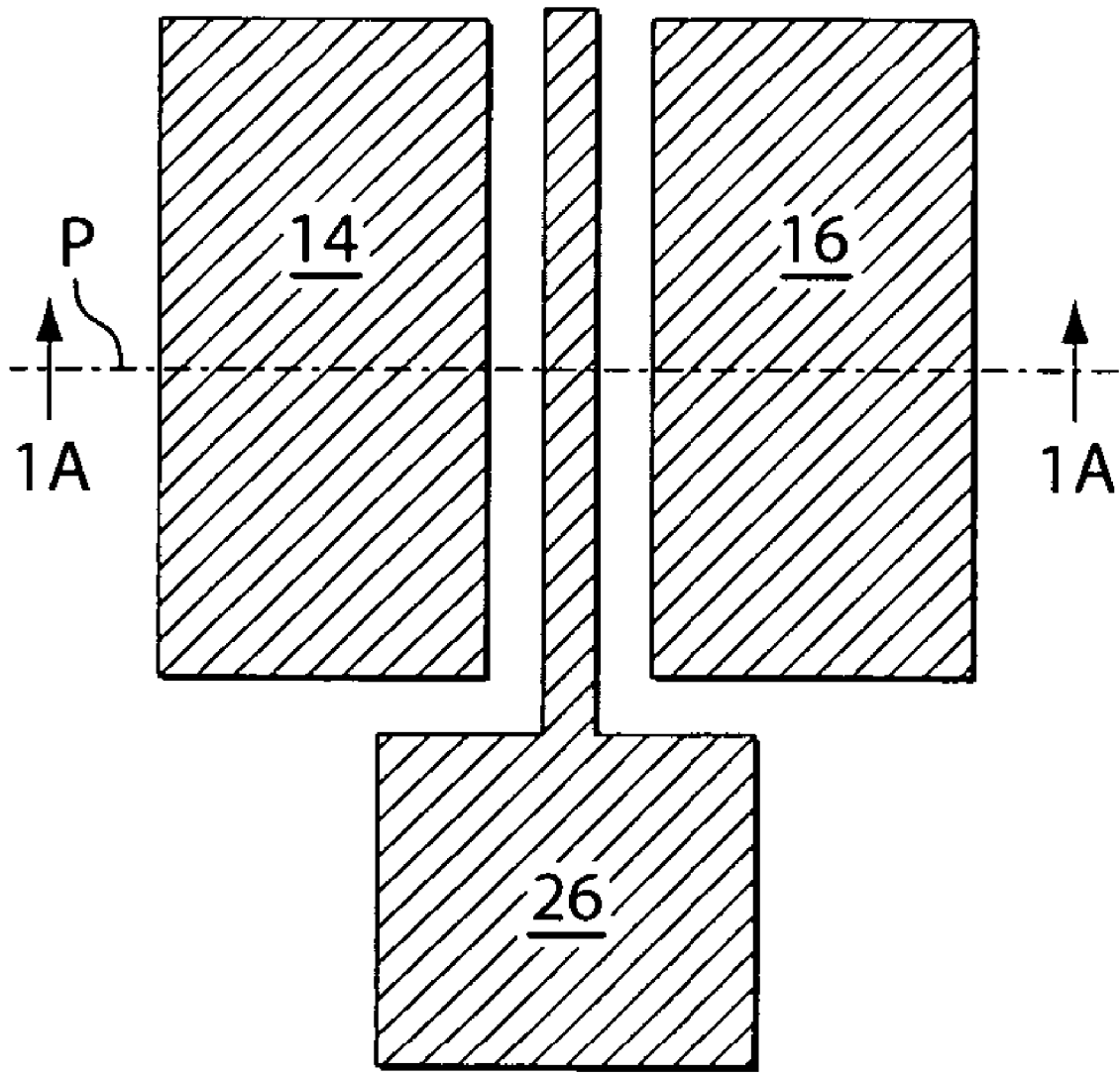
FIG. 1B is a top view of the gallium nitride material device of FIG. 1A.

FIGS. 1A and 1B illustrate a semiconductor device 10 that includes a gallium nitride material region 12 according to one embodiment of the invention. In the illustrative embodiment, device 10 is a field effect transistor (FET) that includes a source electrode 14, a drain electrode 16 and a gate electrode 18 formed on the gallium nitride material region. The gallium nitride material region is formed on a substrate 20 and, as shown, a transition layer 22 may be formed between the substrate and the gallium nitride material region. The device includes an electrode-defining layer 24 which, as shown, is a passivating layer that protects and passivates the surface of the gallium nitride material region. A via 26 is formed within layer 24 in which the gate electrode is, in part, formed. As described further below, the shape and dimensions of the via and, thus the gate electrode, can be controlled to improve properties of the device.

Though in the illustrative embodiment of FIGS. 1A and 1B device 10 is a PET, the invention encompasses other types of devices as described further below. It should be understood that in non-FET embodiments of the invention, the electrode-defining layer may define other types of electrode than gate electrodes, such as Schottky contacts. Also, though the electrode-defining layer in FIGS. 1A and 1B functions as a passivating layer, in other embodiments the electrode-defining layer may not function as a passivating layer (e.g., see FIG. 4).

When a layer is referred to as being "on" or "over" another layer or substrate, it can be directly on the layer or substrate, or an intervening layer also may be present. A layer that is "directly on" another layer or substrate means that no intervening layer is present. It should also be understood that when a layer is referred to as being "on" or "over" another layer or substrate, it may cover the entire layer or substrate, or a portion of the layer or substrate.

As used herein, the term "passivating layer" refers to any layer that when grown on an underlying layer (e.g. gallium nitride material region 12) reduces the number and/or prevents formation of surface/interface states in the bandgap of the underlying layer, or reduces the number and/or prevents formation of free carrier (e.g., electron or hole) trapping states at the surface/interface of the underlying layer. The trapping states, for example, may be associated with surface states created by unterminated chemical bonds, threading dislocations at the surface or ions adsorbed to the surface from the environment. In a PET device, the trapping states may capture free carriers or may create undesired depletion regions during DC or RF operation. These effects may cause a decrease in the amount of current that otherwise would flow in a channel of the PET during operation, thus, impairing the performance of the device. The passivating layer may substantially reduce these effects thereby improving electrical performance of the device such as increased output power or efficiency. The passivating layer may also increase the breakdown voltage of the device.

It should be understood that a passivating layer may also protect the underlying layer (e.g. gallium nitride material region 12) during subsequent processing steps including photolithography, etching, metal (e.g., gate, interconnect) deposition, implantation, wet chemical, and resist strip (e.g., in a plasma) steps. Thus, a passivating layer may limit or eliminate reactions and/or interactions of other processing species (e.g., liquids, ions, plasmas, gaseous species) with the surface of the gallium nitride material. These reactions and/or interactions can be detrimental to the electrical properties of the device by changing surface morphology, the number of surface states, the amount of surface charge, the polarity of surface charge, or any combination of these.

Suitable compositions for electrode-defining layer 24 include, but are not limited to, nitride-based compounds (e.g., silicon nitride compounds), oxide-based compounds (e.g., silicon oxide compounds), polyimides, other dielectric materials, or combinations of these compositions (e.g., silicon oxide and silicon nitride). In some cases, it may be preferable for the electrode-defining layer to be a silicon nitride compound (e.g., $Si_3N_4$) or non-stoichiometric silicon nitride compounds. It should be understood that these compositions are suitable when the electrode-defining layer functions as a passivating layer (as shown in FIGS. 1A and 1B) and also when the electrode-defining layer does not function as a passivating layer.

The thickness of electrode-defining layer 24 depends on the design of the device. In some cases, the electrode-defining layer may have a thickness of between about 50 Angstroms and 1.0 micron. In some cases, the thickness may be between about 700 Angstroms and about 1200 Angstroms.

As shown, electrode-defining layer 24 covers the entire surface of gallium nitride material region 12 with the exception of the electrode regions (source 14, drain 16 and gate 18).

Figure 2:
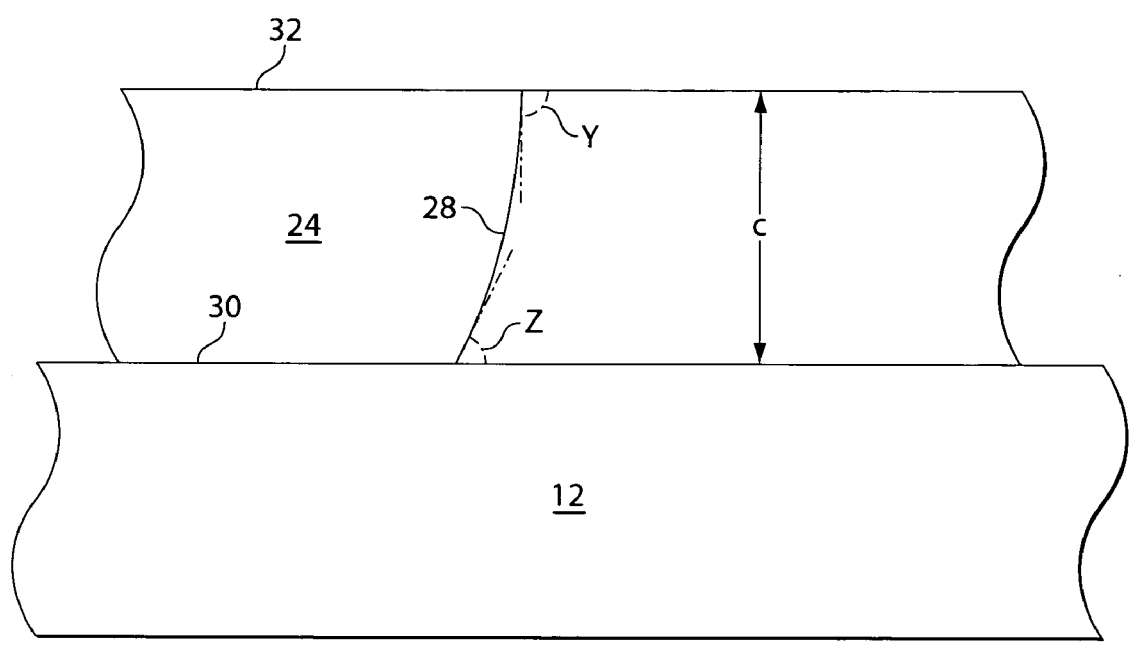
FIG. 2 shows the profile of an electrode-defining layer according to an embodiment of the invention.

The following designations are used in FIGS. 1–2 to represent the noted dimensions: gate length (i.e., cross-sectional dimension of gate at bottom of the via) (a), cross-sectional dimension at top of the via (b), electrode-defining layer thickness (c), source electrode side overhang distance (d), drain electrode side overhang distance (e), gate-source spacing (f), gate-drain spacing (g), and gate electrode height (h).

It should be understood that the cross-sectional dimensions referred to above are measured in a plane P (FIG. 1B) that is perpendicular to the source and drain electrodes and defines the minimum distance therebetween.

FIG. 2 illustrates the profile of the via and corresponding gate electrode. An angle Z is the angle that a sidewall 28 of the electrode-defining layer extends upward from a bottom surface 30 of the electrode-defining layer and an angle Y is the angle that the sidewall extends downward from a top surface 32 of the electrode-defining layer. It should be understood that angles Y and Z are respectively measured at bottom and top surfaces 30, 32 and that sidewall 28 may deviate from these angles at distances away from the bottom and top surfaces.

Though the above-noted dimensions and angles are shown relative to the gate electrode in the FET embodiments of FIGS. 1 and 2, some of these dimensions and angles may also be applied to other types of electrodes in non-FET embodiments as described further below.

Advantageously, methods of forming devices of the invention, described further below, allow definition of gate electrode dimensions (e.g., a) entirely within the electrode-defining layer. This is to be distinguished from processes that form gate electrodes prior to electrode-defining layer deposition, or processes that define a portion of the gate electrode within a electrode-defining layer but not gate length (a). Such processes that form a portion of the gate electrode within a electrode-defining layer but, for example, may include regions (e.g., regions proximate bottom surface 30 that undercut the electrode-defining layer) within the via that are not completely filled by gate electrode material. In these processes, the gate length, therefore, may not be entirely defined by the electrode-defining layer. In contrast, in some preferred methods of the present invention, the entire via (or, at least, regions of the via at bottom surface 30) is filled with the gate electrode material so that the dimensions of the via precisely correspond to gate dimensions and, in particular, the gate length. Thus, using the methods of the invention, critical electrode dimensions (e.g., gate length) can be precisely controlled to optimize device performance. One aspect of the invention is the discovery that certain gate electrode dimensions (including the gate electrode profile) lead to performance improvements in FET device 10.

Figure 15:
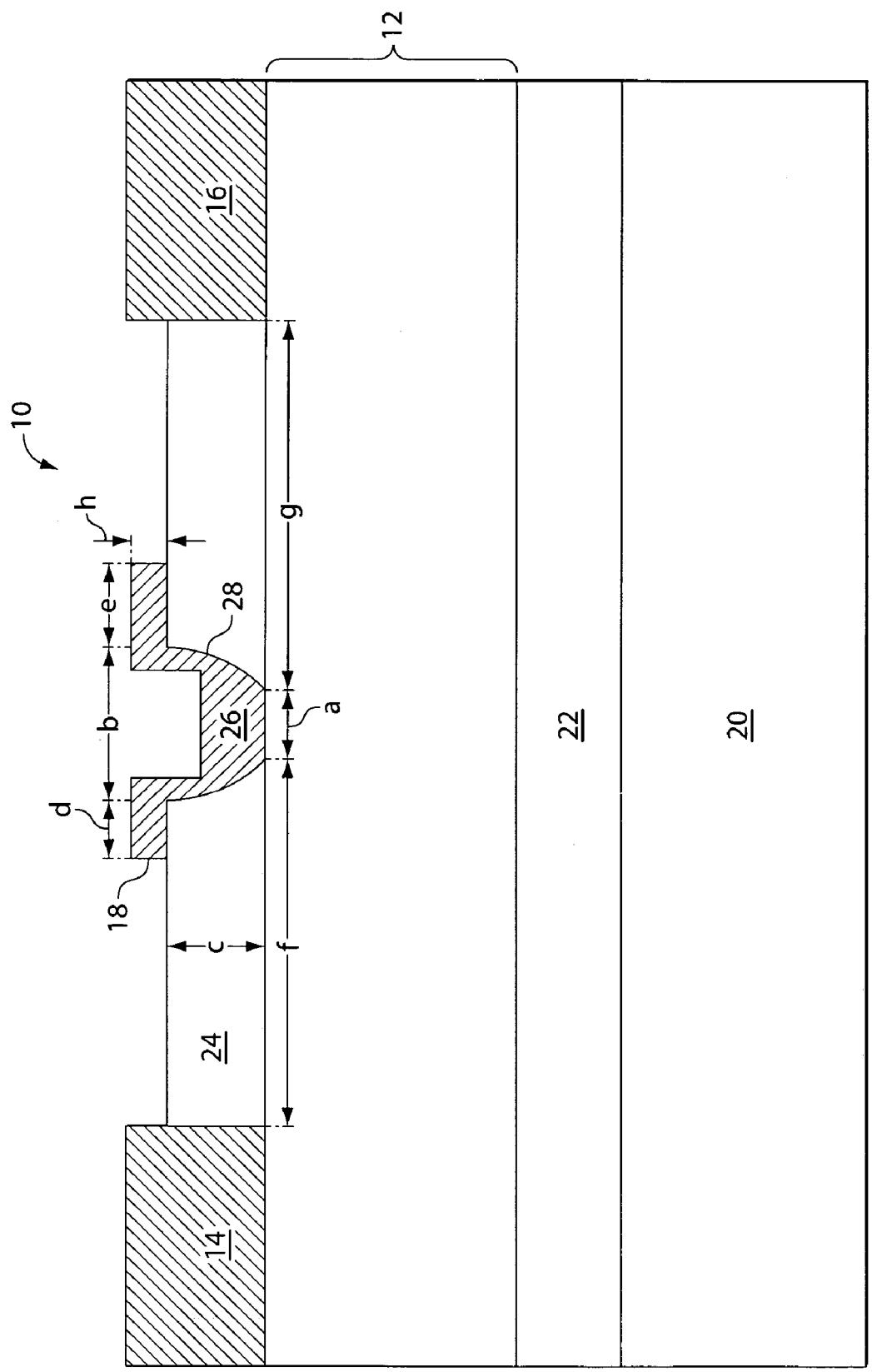
FIG. 15 is a cross-section of a gallium nitride material device that includes a gate electrode height that is less than the thickness of the passivating layer according to an embodiment of the invention.

It should be understood that in certain methods of the invention regions of the via at or proximate top surface 32 may not be filled with gate electrode material if gate electrode height (h) is less than the electrode-defining layer thickness (c) (See FIG. 15).

In the illustrative embodiment of FIGS. 1A and 1B, gate length (a) is smaller than cross-sectional dimension at the top of the via (b). Via 26 (and, thus, gate electrode 18) also has a larger cross-sectional area at the top of the via than a cross-sectional area at the bottom of the via. As shown, the cross-sectional area of the via (and, thus gate electrode) decreases from the top of the via to the bottom of the via. It may be preferable for sidewalls 28 to have a straight (uncurved) slope. In some cases, it may be preferable for sidewalls 28 to have a curved slope. In some cases when the sidewalls have a curved slope, the sidewalls may have a concave-up shape in relation to gallium nitride material region 12 as shown. As described further below, the electrode-defining layer etching step may be controlled to provide the desired gate profile.

It should be understood that the cross-sectional areas of the via (and electrodes) are measured in planes that are parallel to the plane defined by the electrode-defining layer as shown.

It has been discovered that the ratio of (a)/(b) can be an important design parameter for device 10 that affects the breakdown voltage. In some embodiments of the invention, the ratio of (a)/(b) is controlled to be between about 0.50 and about 0.95. In some cases, it may be preferred to control the ratio to be between about 0.75 and about 0.90. Values of (a)/(b) ratios within these ranges can improve the breakdown voltage. The optimal value of the (a)/(b) ratio depends on the specific device and also can depend on other design parameters. As described further below, parameters of the electrode-defining layer etching step may be controlled to provide the desired (a)/(b) ratio.

The absolute value of gate length (a) depends on the particular device design. For example, (a) may be between about 0.1 micron and about 5.0 micron. However, it should be understood that other values for (a) may also be suitable.

It has also been discovered that angles Y and Z have preferred ranges for device operation. It may be preferable for angle Z to be less than 90 degrees. For example, it may be preferable for angle Z to be between about 5 degrees and about 85 degrees; in some cases, between about 10 degrees and about 60 degrees; and, in some cases, between about 15 degrees and about 40 degrees. It may be preferable for angle Y to be greater than 90 degrees. Angle Y typically is between about 90 degrees and about 160 degrees. It may be preferred for angle Y to be between about 90 degrees and about 135 degrees; and, in some cases, between about 90 degrees and about 110 degrees.

It has been determined that angles Y and Z affect the location and strength of electrical fields generated by the device. By controlling the values of Y and Z within the above ranges, the peak electric field established near the drain edge of the gate electrode during device operation can be reduced. This improvement may lead to increased operating voltage and/or reduced gate leakage current. If the values of Y and Z are outside the above ranges, the peak electric field established near the drain edge of the gate electrode may be too high which can lead to excessive gate leakage current and/or pre-mature device failure.

The above-noted ranges of angles Y and Z are also important in promoting complete filling of the via with gate electrode material. The optimal value(s) of angles Y and Z depend on the specific device and also can depend on other design parameters. The electrode-defining layer etching step may be controlled to provide the desired values of angles Y and Z, as described further below.

As described further below, angles Y and Z may also be important in non-FET devices such as Schottky diodes (e.g., See FIGS. 5A and 5B).

Figure 13A:
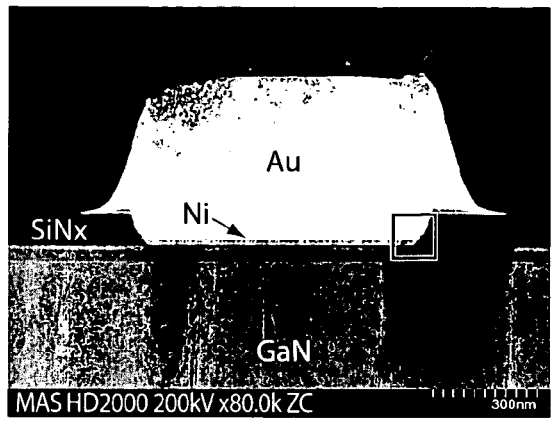
FIG. 13A shows the cross-section of a T-shaped gate electrode of a FET device of the present invention as described in Example 1.

It should be understood that the angles referred to herein are to be measured on a microscopic scale (e.g., dimensions of greater than about 50 or 100 Angstroms), for example using an SEM (as shown in FIG. 13A). The angles are not intended to be measured on an atomic scale, for example using a TEM, which indicates the presence surface effects (e.g., monolayers of atoms) that may distort values of the angles.

It is also preferred for the gate electrode to have a T-shape design which includes portions that overhang underlying electrode-defining layer 24. It has been determined that drain electrode side overhang distance (e) is particularly important in effecting the breakdown voltage of the device. The portion of the gate electrode that overhangs the electrode-defining layer in the direction of the drain electrode can function as a field plate which increases the breakdown voltage of the device, amongst other beneficial effects. It has been observed that the breakdown voltage may be increased, for example, when (e) is between about 2 percent and about 60 percent of the gate drain spacing (g). In some cases, it may be preferred for (e) to be between about 10 percent and about 50 percent of (g) to further optimize the breakdown voltage of the device. The optimal value(s) of (e) depend on the specific device and also can depend on other design parameters.

It has also been observed that it is advantageous to control the source electrode side overhang distance (d) to be less than drain electrode side overhang distance (e). In some cases, it is preferable to have (d) be less than 50 percent of (e), or even less than 20% of (e). In some cases, it is advantageous to minimize (d) while ensuring that the entire via is filled. Reducing the value of (d) limits, or prevents, unwanted gate-source capacitance.

The values of (d) and (e) are controlled, in part, by the metal deposition and patterning steps described further below.

The absolute values of the source electrode side overhang distance (d), drain electrode side overhang distance (e), gate-source spacing (t) and gate-drain spacing (g) depend on the device design. Typical values of (f) and (g) are between about 0.1 micron and about 10 micron, though other values are possible.

In some embodiments, the value of the gate electrode height (h) is greater than the value of the electrode-defining layer thickness (c) (See FIG. 1A). In other embodiments, the value of the gate electrode height (h) is less than the value of the electrode-defining layer thickness (c) (See FIG. 15). Though not as critical as other gate dimensions, preferred values of (h) depend on the specific device and also can depend on other design parameters. For example, (h) may be between about 100 Angstroms and 2.0 micron. The value of (h) may be controlled by processing conditions used to deposit the gate electrode material as described further below.

Gate electrode 18 may be formed of any suitable conductive material such as metals (e.g., Au, Ni), metal compounds (e.g., WSi, WSiN), alloys, semiconductors, polysilicon, nitrides, or combinations of these materials. For example, the gate electrode may be formed of gold, nickel or both. Advantageously, forming the gate electrode in via 26 enables formation of gate electrodes that include a single conductive material component (e.g., nickel) in direct contact with the gallium nitride material region across the entire gate length, even in cases when the gate electrode also includes a second conductive material component. For example, when the gate electrode is formed of nickel and gold, the nickel layer may be in direct contact with the gallium nitride material region across the entire gate length and the gold layer may be formed over the nickel layer (e.g., see FIG. 13A). In contrast, prior art techniques for forming gate electrodes that include multiple metal compositions may have a first component (e.g., nickel) that is in direct contact with interior portions of the gate length and a second component (e.g., gold) in direct contact with edge portions of the gate length (e.g., see FIG. 13B). Providing a single component in direct contact with the gallium nitride material region across the entire gate length can improve electrical properties, such as reducing gate leakage current, by eliminating losses that may occur when a second component is in direct contact with portions of the gate length. Furthermore, when multiple components are in direct contact with the gallium nitride material region, the Schottky barrier height of the gate electrode may not be controlled by material composition.

It should also be understood that the source and drain electrodes 14 and 16 may also be formed of any suitable conducting material including the same materials described above in connection with the gate electrode, as well as Ti, Al, Pt or Si.

In certain preferred embodiments, substrate 20 is a silicon substrate. As used herein, a silicon substrate refers to any substrate that includes a silicon surface. Examples of suitable silicon substrates include substrates that are composed entirely of silicon (e.g., bulk silicon wafers), silicon-on-insulator (SOI) substrates, silicon-on-sapphire substrate (SOS), and SIMOX substrates, amongst others. Suitable silicon substrates also include substrates that have a silicon wafer bonded to another material such as diamond, AlN, or other polycrystalline materials. Silicon substrates having different crystallographic orientations may be used. In some cases, silicon (111) substrates are preferred. In other cases, silicon (100) substrates are preferred.

It should be understood that other types of substrates may also be used including sapphire, silicon carbide, gallium nitride and aluminum nitride substrates.

Substrate 20 may have any suitable dimensions and its particular dimensions are dictated by the application. Suitable diameters include, but are not limited to, 2 inches (50 mm), 4 inches (100 mm), 6 inches (150 mm), and 8 inches (200 mm). In some embodiments, substrate 20 is relatively thick, for example, greater than 250 microns. Thicker substrates are generally able to resist bending which can occur, in some cases, in thinner substrates. In other embodiments, thinner substrates (e.g., less than 250 microns) are used.

Transition layer 22 may be formed on substrate 20 prior to the deposition of gallium nitride material region 12. The transition layer may accomplish one or more of the following: reducing crack formation in the gallium nitride material region 12 by lowering thermal stresses arising from differences between the thermal expansion rates of gallium nitride materials and the substrate; reducing defect formation in gallium nitride material region by lowering lattice stresses arising from differences between the lattice constants of gallium nitride materials and the substrate; and, increasing conduction between the substrate and gallium nitride material region by reducing differences between the band gaps of substrate and gallium nitride materials. The presence of the transition layer may be particularly preferred when utilizing silicon substrates because of the large differences in thermal expansion rates and lattice constant between gallium nitride materials and silicon. It should be understood that the transition layer also may be formed between substrate 20 and gallium nitride material region for a variety of other reasons. In some cases, for example when a silicon substrate is not used, the device may not include a transition layer.

The composition of transition layer 22 depends, at least in part, on the type of substrate and the composition of gallium nitride material region 12. In some embodiments which utilize a silicon substrate, the transition layer may preferably comprise a compositionally-graded transition layer having a composition that is varied across at least a portion of the layer. Suitable compositionally-graded transition layers, for example, have been described in commonly-owned U.S. Pat. No. 6,649,287, entitled "Gallium Nitride Materials and Methods," filed on Dec. 14, 2000, which is incorporated herein by reference. Compositionally-graded transition layers are particularly effective in reducing crack formation in the gallium nitride material region by lowering thermal stresses that result from differences in thermal expansion rates between the gallium nitride material and the substrate (e.g., silicon). In some embodiments, when the compositionally-graded, transition layer is formed of an alloy of gallium nitride such as $Al_xIn_yGa_{(1-x-y)}N$, $Al_xGa_{(1-x)}N$, or $In_yGa_{(1-y)}N$, wherein $0 \leq x \leq 1, 0 \leq y \leq 1$. In these embodiments, the concentration of at least one of the elements (e.g., Ga, Al, In) of the alloy is typically varied across at least a portion of the cross-sectional thickness of the layer. In some cases, the transition layer has a monocrystalline structure.

In other embodiments, transition layer 22 has a constant (i.e., non-varying) composition across its thickness. Such transition layers may also be referred to as buffer layers.

In some embodiments, device 10 may also optionally include other layers that are not depicted in the figures. For example, device 10 may include one or more intermediate layers. An intermediate layer may be formed, for example, between the substrate and the transition layer (e.g., a compositionally-graded transition layer) and/or between the transition layer and the gallium nitride material region. Suitable intermediate layers, for example, have been described and illustrated in U.S. Pat. No. 6,649,287, which was incorporated by reference above. In some embodiments, the intermediate layer may have a constant composition of a gallium nitride alloy (such as $Al_xIn_yGa_{(1-x-y)}N$, $Al_xGa_{(1-x)}N$, or $In_yGa_{(1-y)}N$), aluminum nitride, or an aluminum nitride alloy. In some cases, the intermediate layer(s) have a monocrystalline structure.

Gallium nitride material region 12 comprises at least one gallium nitride material layer. As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_aP_bN_{(1-a-b)}$), aluminum indium gallium arsenide phosporide nitride ($Al_xIn_yGa_{(1-x-y)}As_aP_bN_{(1-a-b)}$), amongst others. Typically, when present, arsenic and/or phosphorous are at low concentrations (i.e., less than 5 weight percent). In certain preferred embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x+y=0). Gallium nitride materials may be doped n-type or p-type, or may be intrinsic. Suitable gallium nitride materials have been described in U.S. Pat. No. 6,649,287, incorporated by reference above.

In some cases, gallium nitride material region 12 includes only one gallium nitride material layer. In other cases, gallium nitride material region 12 includes more than one gallium nitride material layer. The different layers can form different regions of the semiconductor device. Gallium nitride material region 12 also may include one or more layers that do not have a gallium nitride material composition such as other III-V compounds or alloys, oxide layers, and metallic layers.

Gallium nitride material region 12 is of high enough quality so as to permit the formation of devices therein. Preferably, gallium nitride material region 12 has a low crack level and a low defect level. As described above, transition layer 22 (particularly when compositionally-graded) may reduce crack and/or defect formation. In some embodiments, the gallium nitride material region has about $10^9$ defects/cm$^2$. Gallium nitride materials having low crack levels have been described in U.S. Pat. No. 6,649,287 incorporated by reference above. In some cases, the gallium nitride material region a crack level of less than 0.005 μm/μm$^2$. In some cases, the gallium nitride material region has a very low crack level of less than 0.001 μm/μm$^2$. In certain cases, it may be preferable for gallium nitride material region to be substantially crack-free as defined by a crack level of less than 0.0001 μm/μm$^2$.

In certain cases, gallium nitride material region 12 includes a layer or layers which have a monocrystalline structure. In some cases, the gallium nitride material region includes one or more layers having a Wurtzite (hexagonal) structure.

The thickness of gallium nitride material region 12 and the number of different layers are dictated, at least in part, by the requirements of the specific device. At a minimum, the thickness of gallium nitride material region 12 is sufficient to permit formation of the desired device. Gallium nitride material region 12 generally has a thickness of greater than 0.1 micron, though not always. In other cases, gallium nitride material region 12 has a thickness of greater than 0.5 micron, greater than 0.75 micron, greater than 1.0 microns, greater than 2.0 microns, or even greater than 5.0 microns.

Figure 3:
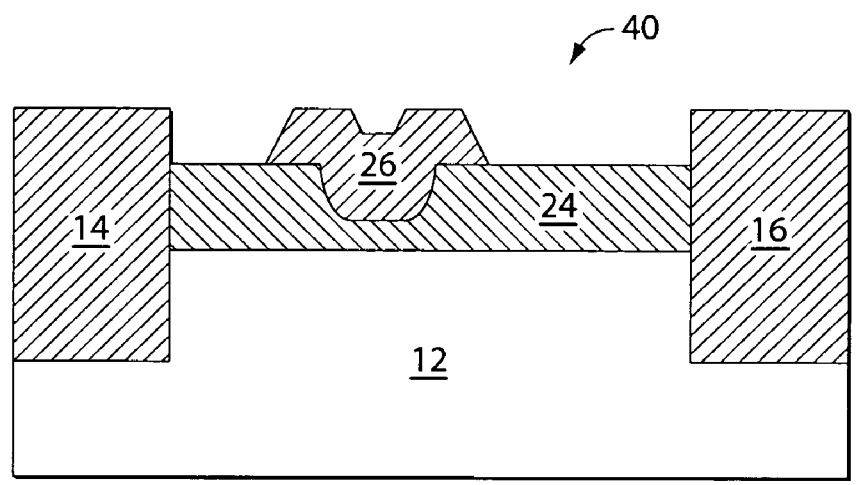
FIG. 3 is a cross-section of a gallium nitride material device including an electrode-defining layer that includes a via that extends only a portion through the thickness of the electrode-defining layer according to an embodiment of the invention.

FIG. 3 illustrates a semiconductor device 40 according to another embodiment of the invention. In the embodiment of FIG. 3, via 26 extends only a portion of the way through the thickness of electrode-defining layer 24. Thus, a portion of the electrode-defining layer remains between gate electrode 18 and gallium nitride material region 12. In some embodiments, it is preferred that the electrode-defining layer is formed of an insulating material such as silicon oxide, silicon nitride, polyimides, other dielectric materials, or combinations of these compositions (e.g., silicon oxide and silicon nitride). In embodiments in which the electrode-defining layer is formed of an insulating material, device 40 forms a MISFET (metal-insulator-semiconductor).

Figure 4:
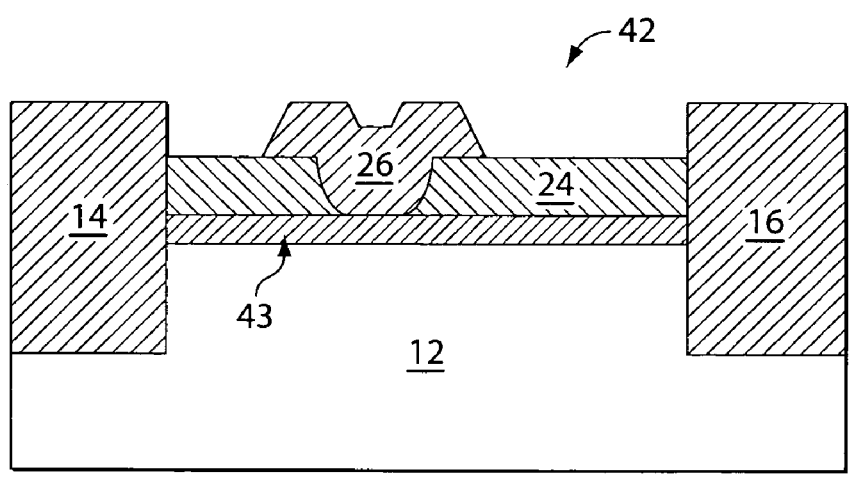
FIG. 4 is a cross-section of a gallium nitride material device including a passivating layer formed between the electrode-defining layer and gallium nitride material region according to an embodiment of the invention.

FIG. 4 illustrates a semiconductor device 42 according to another embodiment of the invention. Device 42 includes a layer 43 formed between electrode-defining layer 24 and gallium nitride material region 12. Layer 43 has a different composition than electrode-defining layer 24. In some cases, it is preferred that layer 43 is a passivating layer. Suitable passivating layer compositions have been described above. It should be understood that, in some cases, more than one layer may be formed between the electrode-defining layer and the gallium nitride material region.

Figure 5A:
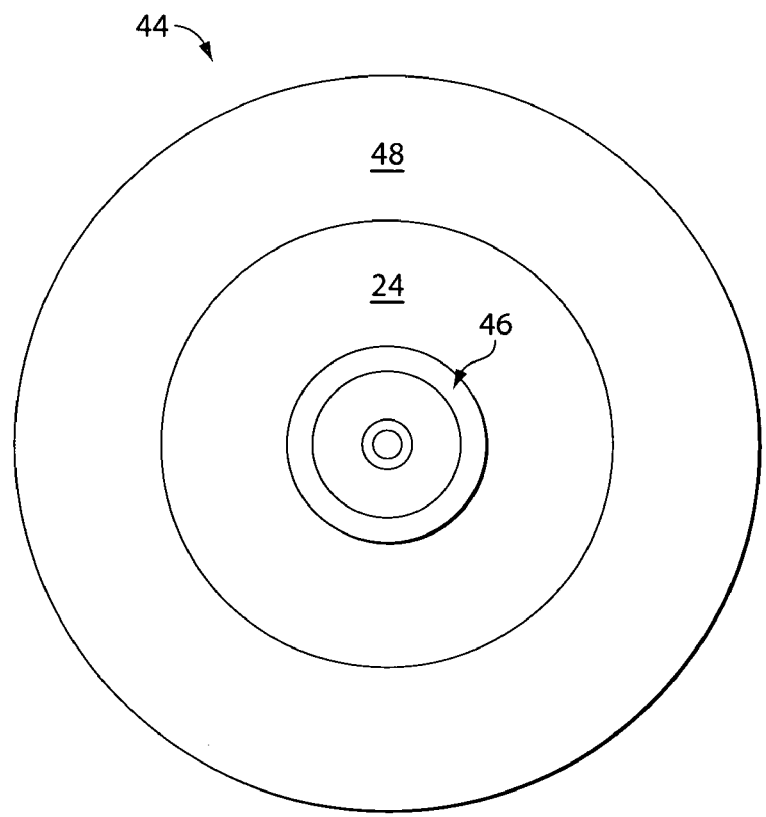
FIGS. 5A and 5B respectively are a top view and a cross-section of a Schottky diode according to an embodiment of the invention.
Figure 5B:
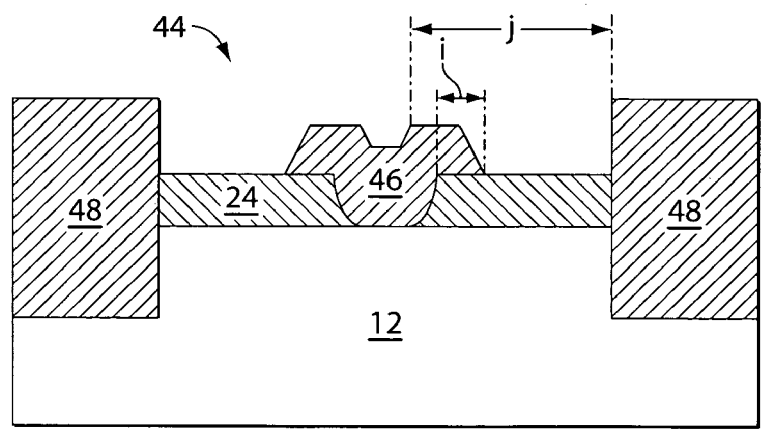

FIGS. 5A and 5B illustrate a semiconductor device 44 according to another embodiment of the invention. In this embodiment, device 44 is a Schottky diode that includes a Schottky electrode (i.e., Schottky contact) 46 defined (in part) within via 26. Device 44 also includes an ohmic electrode 48 that is formed around the diameter of the structure.

The above-noted ranges of angles Y and Z in connection with the FET embodiment are also important in Schottky diode embodiments (and other devices). In particular, values of Y and Z within the above-noted ranges promote complete filling of the via with electrode material, amongst other advantages. The optimal value(s) of angles Y and Z depend on the specific device and also can depend on other design parameters. The electrode-defining layer etching step may be controlled to provide the desired values of angles Y and Z, as described further below.

It is also preferred for Schottky electrode 46 to have a T-shape design which includes portions that overhang underlying electrode-defining layer 24, as described in connection with the FET embodiment of FIGS. 1A and 1B. It has been determined that overhang distance (i) is particularly important in affecting the breakdown voltage of the device. The-portion of the Schottky electrode that overhangs the electrode-defining layer in the direction of the ohmic electrode can function as a field plate which increases the breakdown voltage of the device, amongst other beneficial effects. It has been observed that the breakdown voltage may be increased, for example, when (i) is between about 2 percent and about 60 percent of a distance (j) between the Schottky electrode and the ohmic electrode. In some cases, it may be preferred for (i) to be between about 10 percent and about 50 percent of (j) to further optimize the breakdown voltage of the device. The optimal value(s) of (j) depend on the specific device and also can depend on other design parameters.

It should be understood that Schottky diodes of the invention may also have a non-circular layout.

It should also be understood that although the present invention has been described above in connection with a transistor and Schottky diode, the invention may encompass other devices. For example, other electronic or electro-optical devices may use a electrode-defining layer (which, in some cases, may also function as a passivating layer). Suitable devices include Schottky rectifiers, Gunn-effect diodes, varactor diodes, voltage-controlled oscillators, light emitting diodes, lasers or photodetectors.

FIGS. 6–11 show cross-sections of the resulting semiconductor structure after different processing steps according to one illustrative method of the present invention. Though FIGS. 6–11 show the production of a FET according to one method of the invention, it should also be understood that other devices of the invention may be produced using similar method steps.

Figure 6:
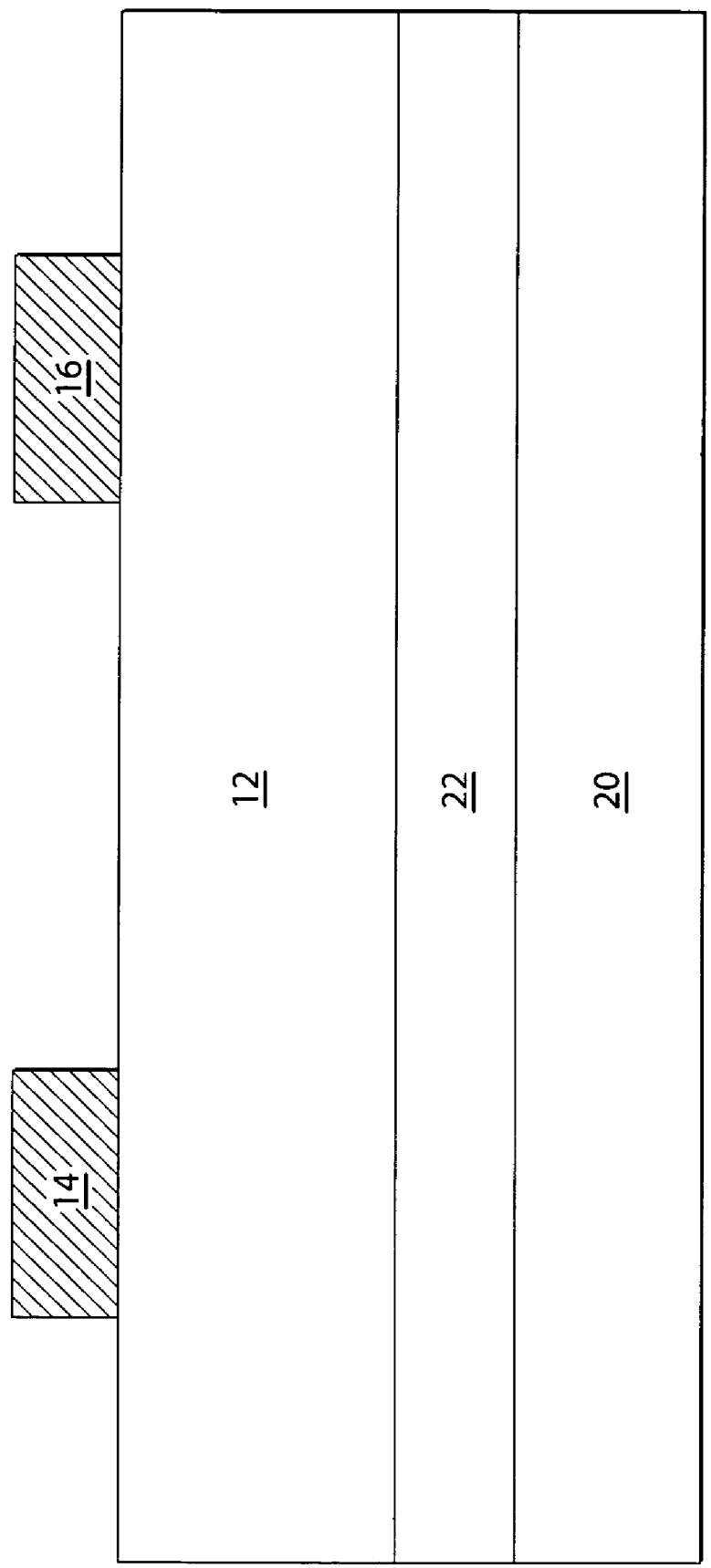
FIG. 6 is a cross-section of a semiconductor structure after a metallization step according to a method of the invention.

FIG. 6 shows a cross-section of the structure after deposition of gallium nitride material region 12 and transition layer 22 on substrate 20 and deposition of source and drain electrodes 14 and 16.

Transition layer 22 and gallium nitride material region 12 may be deposited on substrate 20, for example, using metal organic chemical vapor deposition (MOCVD), molecular beam epitaxy (MBE), and hydride vapor phase epitaxy (HVPE), amongst other techniques. In some cases, an MOCVD process may be preferred. A suitable MOCVD process to form a compositionally-graded transition layer and gallium nitride material region over a silicon substrate has been described in U.S. Pat. No. 6,649,287 incorporated by reference above. When gallium nitride material region 12 has different layers, in some cases it is preferable to use a single deposition step (e.g., an MOCVD step) to form the entire region 12. When using the single deposition step, the processing parameters are suitably changed at the appropriate time to form the different layers. In certain preferred cases, a single growth step may be used to form the transition layer and gallium nitride material region.

In other embodiments of the invention (not shown), it is possible to grow gallium nitride material region 12 using a lateral epitaxial overgrowth (LEO) technique that involves growing an underlying gallium nitride layer through mask openings and then laterally over the mask to form the gallium nitride material region, for example, as described in U.S. Pat. No. 6,051,849, which is incorporated herein by reference. The mask regions are not shown in the figures.

In other embodiments of the invention (not shown), it is possible to grow region 12 using a pendeoepitaxial technique that involves growing sidewalls of gallium nitride material posts into trenches until growth from adjacent sidewalls coalesces to form a gallium nitride material region, for example, as described in U.S. Pat. No. 6,177,688, which is incorporated herein by reference. In these lateral growth techniques, gallium nitride material regions with very low defect densities are achievable. For example, at least a portion of the gallium nitride material region may have a defect density of less than about $10^5$ defects/cm$^2$.

Source and drain electrodes 14, 16 may be deposited on the gallium nitride material region using known techniques such as an evaporation technique. In cases when the electrodes include two metals, then the metals are typically deposited in successive steps. The deposited metal layer may be patterned using conventional methods to form the electrodes.

The structure shown in FIG. 6 may be subjected to a rapid thermal annealing (RTA) step in which, for example, the structure is heated to temperatures of between about 500 degrees C. and 1000 degrees C. In some cases, the temperature may be between about 800 degrees C and 900 degrees C. The annealing step is performed to promote alloying of the different materials in the source and drain electrodes and to promote formation of intimate contact between these electrodes and the underlying gallium nitride material region.

Figure 7:
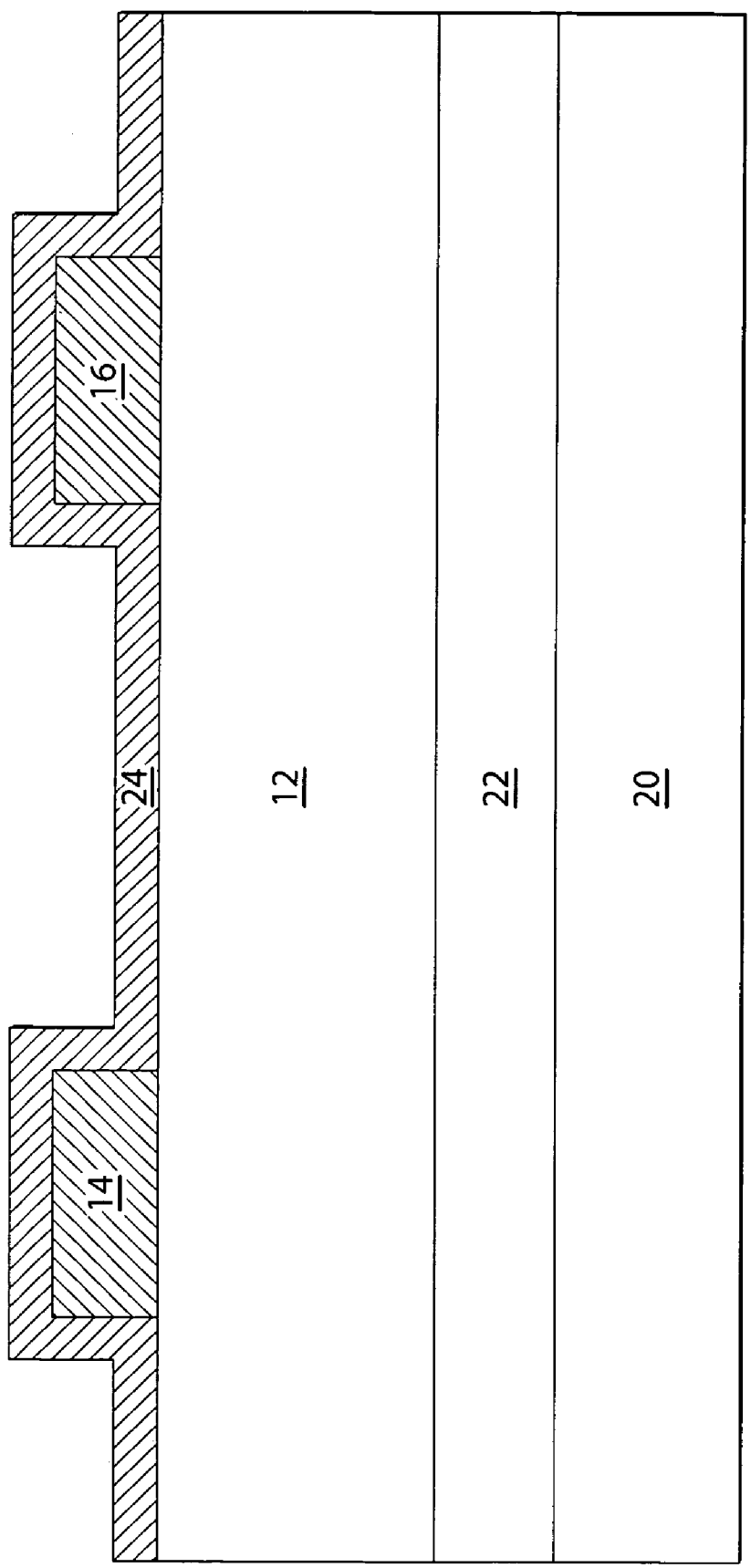
FIG. 7 is a cross-section of a semiconductor structure after deposition of an electrode-defining layer according to a method of the invention.

FIG. 7 shows a cross-section of the semiconductor structure after the deposition of electrode-defining layer 24. As shown, electrode-defining layer 24 covers gallium nitride material region 12 conformally. The electrode-defining layer may be deposited using any suitable technique. The technique used, in part, depends on the composition of the electrode-defining layer. Suitable techniques include, but are not limited to CVD, PECVD, LP-CVD, ECR-CVD, ICP-CVD, evaporation and sputtering. When the electrode-defining layer is formed of a silicon nitride material, it may be preferable to use PECVD to deposit the layer.

As noted above, depositing the electrode-defining layer prior to formation of the gate electrode advantageously enables the electrode-defining layer to passivate and protect the gallium nitride material region during subsequent processing steps including the step of forming the gate electrode. It should be understood that in other methods of the invention that the electrode-defining layer may be deposited prior to the deposition of the source and drain electrodes. In these embodiments, respective vias are opened in the electrode-defining layer, for example using etching techniques, to enable contact between the source and drain electrodes and the underlying gallium nitride material region.

Figure 8:
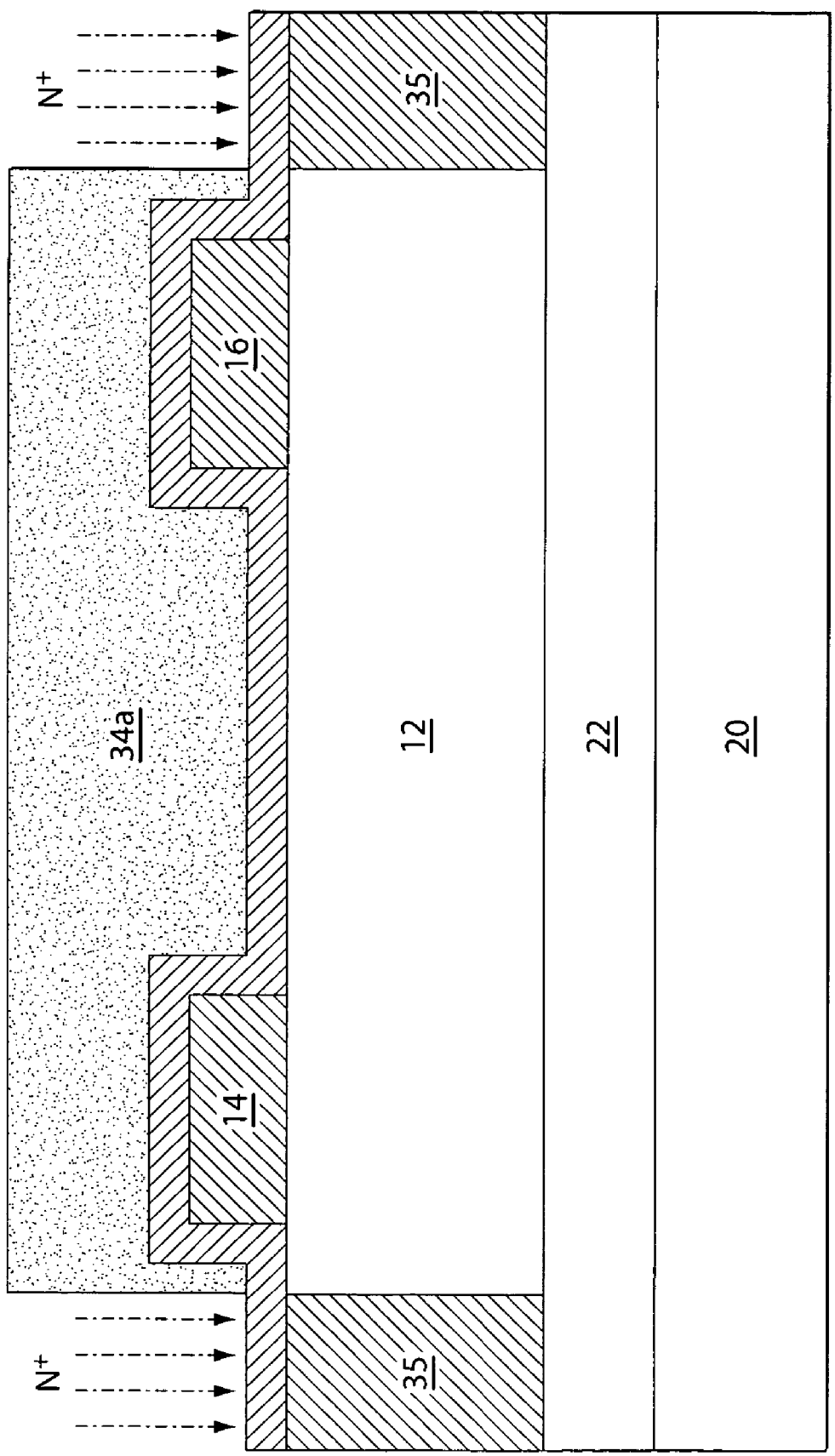
FIG. 8 is a cross-section of a semiconductor structure during an implantation step according to a method of the invention.

FIG. 8 illustrates a cross-section of the structure during an ion implantation step. A photoresist layer 34a is patterned to expose regions on respective sides of the drain and source electrodes. In the illustrative embodiment, nitrogen ions are implanted in the exposed regions to form amorphized gallium nitride material regions 35 underlying the regions. The amorphized regions electrically isolate the devices from adjacent devices formed on the same wafer.

It should be understood that other types of ions may also be used in the implantation step or other techniques for isolating adjacent devices may be utilized. In some cases, adjacent devices may be isolated using an etching step that removes the electrode-defining layer, as well as a portion of the gallium nitride material region. The optimal value of the etch depth depends on the specific device and also can depend on other design parameters. In other cases, it may not be necessary to isolate adjacent devices and, thus, the implant step is not required.

Figure 9:
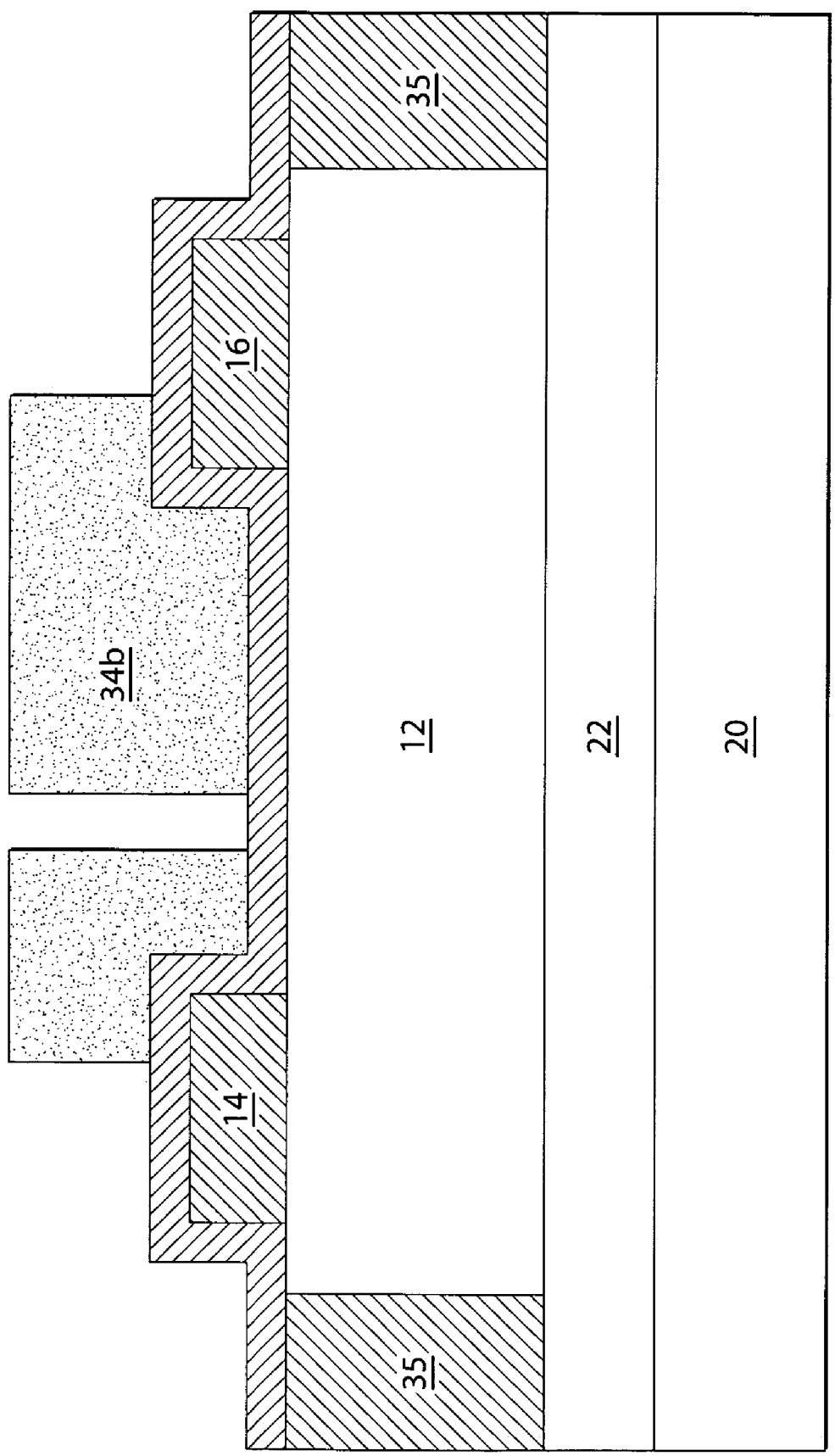
FIG. 9 is a cross-section of a semiconductor structure after a photoresist patterning step according to a method of the invention.

FIG. 9 illustrates a cross-section of the structure after the photoresist layer 34a has been stripped and a second photoresist layer 34b has been patterned.

Figure 10:
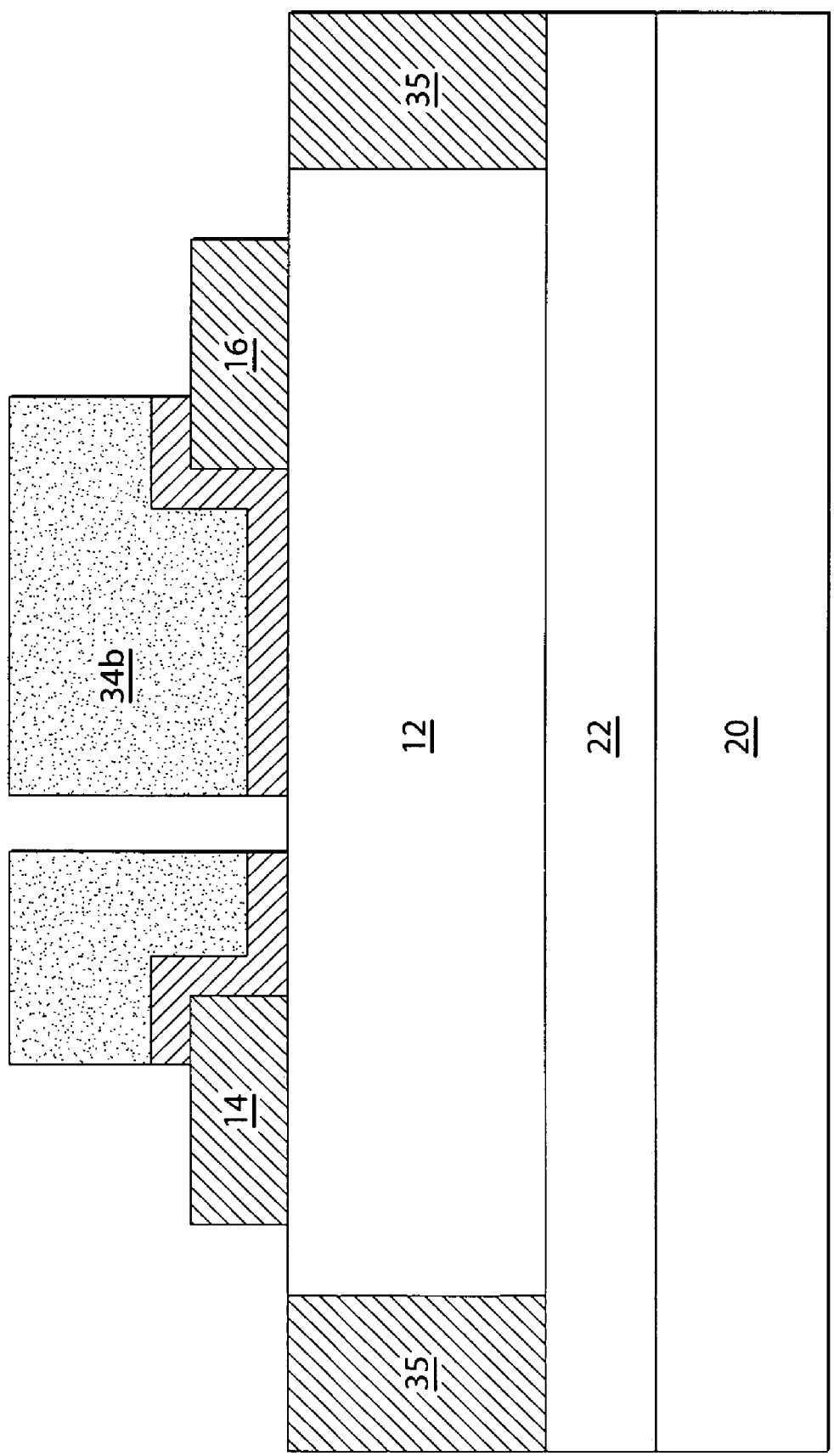
FIG. 10 is a cross-section of a semiconductor structure after a electrode-defining layer etching step according to a method of the invention.

FIG. 10 illustrates a cross-section of the semiconductor structure after photoresist layer 34b has been stripped and after electrode-defining layer 24 has been etched. This etching step forms via 26. A plasma etching technique is preferably used to form the via with controlled dimensions. It has been discovered that certain conventional wet chemical etching techniques do not sufficiently control the critical via dimensions. In some methods, a high density plasma technique (e.g., ICP or ECR) is used to generate the plasma. In other methods, RE or CAIBE techniques may be used. Suitable gases that may be ionized to form the plasma include fluorinated hydrocarbons, fluorinated sulfur-based gases, oxygen and argon. Prior to initiation of the etch, an oxygen-based or argon-based plasma treatment may be used to remove any residual hydrocarbon species on the surface of the electrode-defining layer.

Etching conditions may be controlled to form via 26 with the desired dimensions and profile, as described above. One important processing parameter is the pressure conditions in the plasma which largely determines the mean free path of the plasma species and, consequently, controls the directionality of the etching. The directionality, or anisotropy, of the etching controls the profile of the via, angle Y, and angle Z, amongst other via dimensions (e.g., a, b). It has been discovered that suitable pressure conditions for producing a via having angles Y and Z may be between about 1–100 mTorr.

RF power is another important process parameter for dry etching processes. The RF power affects the ion energy of species that impinge on the surface of the structure being processed. The ion energy affects anisotropy of the etching and, therefore, controls the profile of the via, angles Y and Z, amongst other via dimensions (e.g., a, b). It has been discovered that, in some cases, it may be preferable to maintain RF power at less than about 50 Watts. In some cases, it may be preferable to maintain RF power at less than about 10 Watts. Using RF power within the above ranges may limit, or prevent, plasma-induced damage to the gallium nitride material region which may otherwise be caused when forming the via.

ICP power is another important processing parameter for etching processes that utilize ICP plasmas. ICP power is measured as the power applied to inductive coils outside the walls of a plasma chamber. This power creates a magnetic field that confines and creates a dense plasma. The ICP power, therefore, controls the plasma density (relatively independent of the ion energy) which in turn can be used to control the etch rate of electrode-defining layer, amongst other parameters. In this way, the etch rate can be substantially decoupled from the profile of the via which allows via dimensions to be tailored. It has been discovered that, in some cases, it is preferable to maintain ICP power between about 5 W and about 300 W. In some cases, it may be preferable to maintain ICP power between about 10 W and about 100 W. ICP power values above this range may cause detrimental effects to photoresist layer 34b, while ICP power values below this range may reduce the etch rate of electrode-defining layer 24 to unacceptable levels.

It should be understood that in certain processes that use an ICP plasma the RF power may be within the above-described preferred ranges and, in some cases, may be 0.

This etching step can also remove electrode-defining layer 24 from other exposed regions including those on the source and drain electrodes, as well as over the implanted regions.

Figure 11:
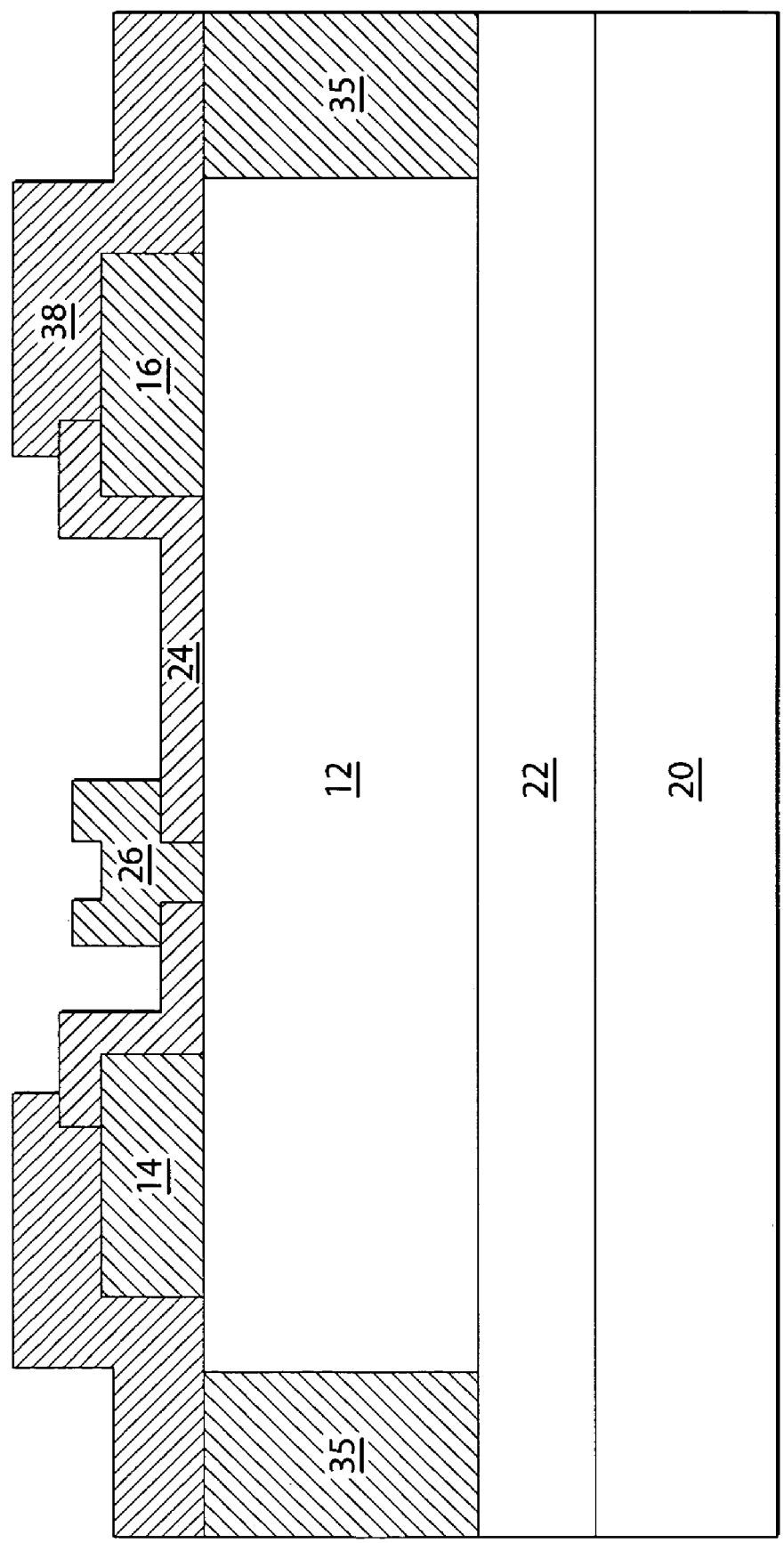
FIG. 11 is a cross-section of a semiconductor structure after a metallization step according to a method of the invention.

FIG. 11 illustrates a cross-section of the semiconductor structure after the gate electrode and interconnect patterning and deposition steps. The patterning step is controlled to provide the desired source electrode side overhang distance (d) and drain electrode side overhang distance (e). Conventional patterning and deposition steps may be used. The gate and interconnects 38 may be patterned and deposited in separate steps or the same step.

Figure 12:
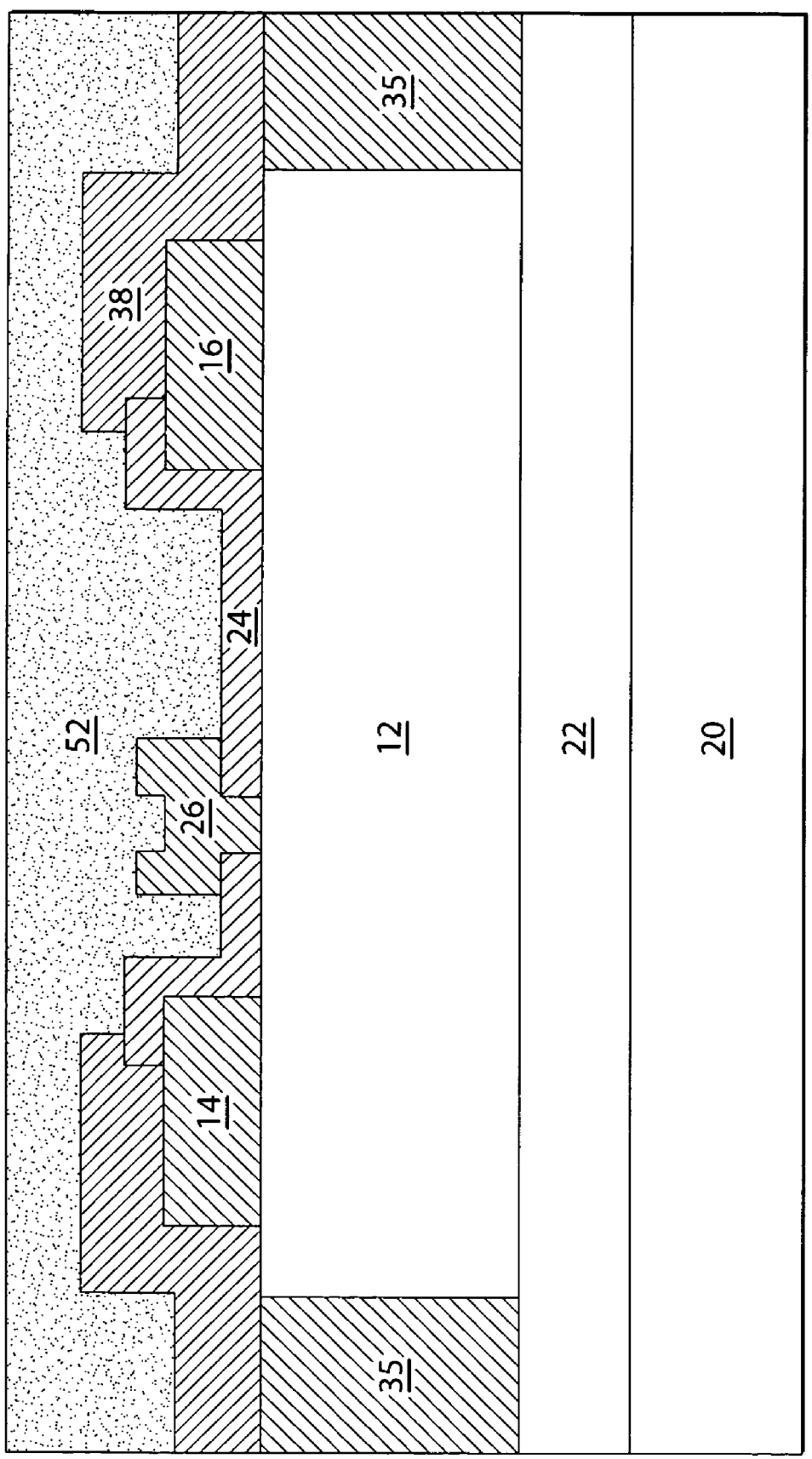
FIG. 12 is a cross-section of a semiconductor structure after an encapsulation step according to a method of the invention.

FIG. 12 illustrates a cross-section of the semiconductor structure after deposition of an encapsulation layer 52.

It should be understood that the invention encompasses other methods than those specifically described herein. Also, variations to the method described above would be known to those of ordinary skill in the art and are within the scope of the invention.

The following examples are meant to be illustrative and are not limiting.

EXAMPLE 1

This example shows the effect of gate-electrode shape and composition on electrical properties by comparing properties of an FET device of the present invention to a conventional FET device.

FIG. 13A shows the cross-section of a T-shaped gate electrode of a FET device of the present invention. The gate electrode is formed in a via that decreases in cross-sectional area from the top of the via to the bottom of the via. The electrode is formed of a nickel component and a gold component. The nickel component is in direct contact with the gallium nitride material region across the entire gate length including its edge portions.

Figure 13B:
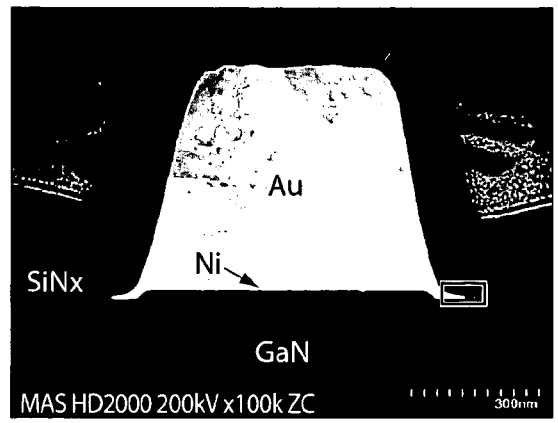
FIG. 13B shows the cross-section a trapezoidal-shaped gate electrode of a conventional FET device as described in Example 1.

FIG. 13B shows the cross-section a trapezoidal-shaped gate electrode of a conventional FET device. The electrode is formed of a nickel component and a gold component. The nickel component is in direct contact with interior portions of the gate length and the gold component is in direct contact with edge portions of the gate length.

Figure 13C:
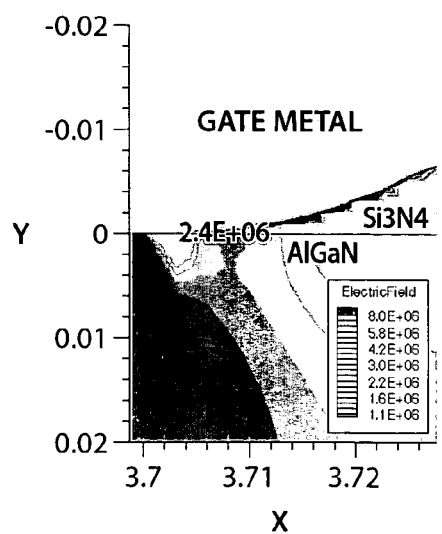
FIGS. 13C and 13D are two-dimensional electric field simulations at the drain edge of the gate electrodes of FIGS 10A and 10B, respectively, as described in Example 1.
Figure 13D:
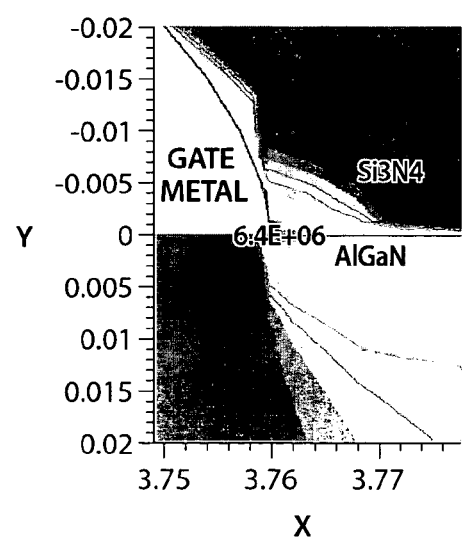

FIGS. 13C and 13D are two-dimensional electric field simulations at the drain edge of the gate electrodes of FIGS.

10A and 10B, respectively. The simulations were performed at $V_{DS}=28$ V and $V_{GS}=0$ V. The peak electric field was $2.4\times10^6$ V/cm for the gate electrode of FIG. 10C and $6.4\times10^6$ V/cm for the gate electrode of FIG. 10D.

The reduced peak electric field for the FET device of the present invention compared to the conventional FET device results from reduced field crowding at the drain edge of the gate electrode. This reduction is attributable to the shape of the gate electrode and, in particular, the shape of the via sidewalls which causes the cross-sectional area of the via to decrease from the top of the via to the bottom of the via. The reduction leads to improved electrical performance characteristics including increased operating voltage and/or reduced gate leakage current.

This example establishes that FET devices of the present invention can have improved electrical properties compared to conventional FET devices.

EXAMPLE 2

This example shows the affect of varying the drain electrode side overhang distance (e) on FET devices of the present invention.

Drain leakage current was measured as a function of drain-source voltage for two FET devices (Device 1 and Device 2) having the same general design as the device shown in FIGS. 1A and 1B. During the measurements, the gate voltage was maintained constant at a value of −8 Volts.

Devices 1 and 2 included the following dimensions:
a=0.7 micron
b=0.9 micron
a/b=0.78
d=0.1 micron
f=1.0 micron
g=3.0 micron
h=5.2 micron
y=100°
z=20°

Device 1 included a drain electrode side overhang distance (e) of 0.15 micron which is 5% of the gate drain spacing (g).

Device 2 included a drain electrode side overhang distance (e) of 0.60 micron which is 20% of the gate drain spacing (g).

Figure 14:
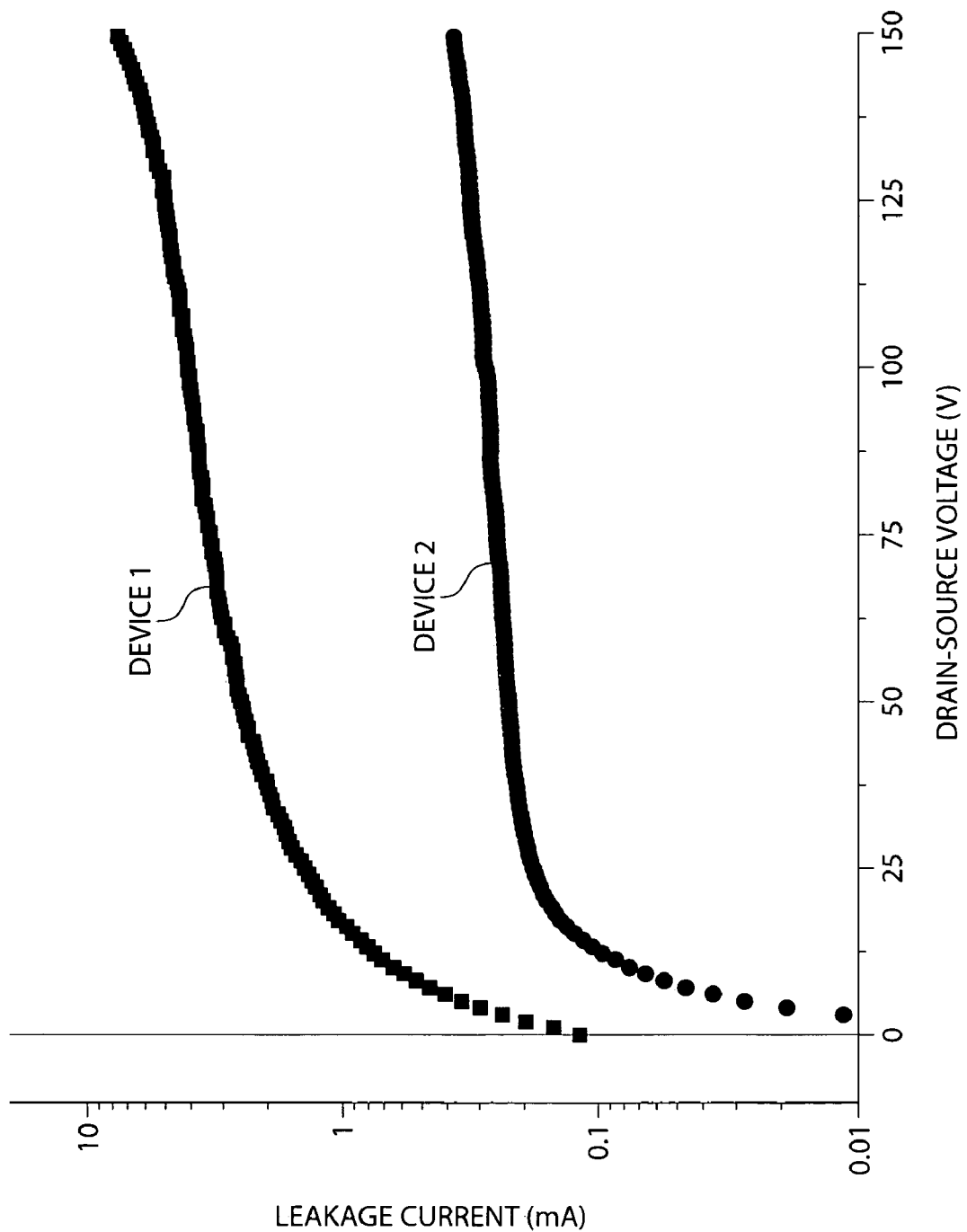
FIG. 14 shows drain leakage current as a function of drain-source voltage for the devices described in Example 2.

FIG. 14 shows the drain leakage currents of Devices 1 and 2 as a function of drain-source voltage. In both devices, the drain leakage current was less than 10 mA at all drain-source voltages which is generally for FET devices having this gate periphery. The drain leakage current in Device 2 is significantly lower than the drain leakage current in Device 1. For this device design, increasing the overhang distance (e) from 5% of the gate drain spacing (g) to 20% of the gate drain spacing resulted in the reduction of the drain leakage current.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A semiconductor structure comprising:
   a gallium nitride material region;
   an electrode-defining layer formed over the gallium nitride material region and including a via formed therein, a cross-sectional area at a top of the via being greater than a cross-sectional area at a bottom of the via;
   first electrode formed on the gallium nitride material region and in the via, wherein the electrode length is defined at the bottom of the via, wherein at least a portion of the first electrode is in direct contact with the gallium nitride material region; and
   a second electrode formed on the gallium nitride material region,
   wherein the electrode-defining layer extends, at least, from the first electrode to the second electrode.

2. The semiconductor structure of claim 1, wherein the first electrode is a gate electrode.

3. The semiconductor structure of claim 2, wherein the second electrode is a source electrode formed on the gallium nitride material region and further comprising a drain electrode formed on the gallium nitride material region.

4. The semiconductor structure of claim 3, wherein the structure is a transistor.

5. The semiconductor structure of claim 1, wherein a sidewall of the electrode-defining layer extends upward from a bottom surface of the electrode-defining layer at an angle between about 10 degrees and about 60 degrees.

6. The semiconductor structure of claim 1, wherein a sidewall of the electrode-defining layer extends upward from a bottom surface of the electrode-defining layer at an angle between about 15 degrees and about 40 degrees.

7. The semiconductor structure of claim 1, wherein a sidewall of the electrode-defining layer extends downward from a top surface of the electrode-defining layer at an angle between about 90 degrees and about 160 degrees.

8. The semiconductor structure of claim 1, wherein a sidewall of the electrode-defining layer extends downward from a top surface of the electrode-defining layer at an angle between about 90 degrees and about 135 degrees.

9. The semiconductor structure of claim 1, further comprising a substrate, wherein the gallium nitride material region is formed on the substrate.

10. The semiconductor structure of claim 9, wherein the substrate is silicon.

11. The semiconductor structure of claim 9, further comprising a transition layer formed between the gallium nitride material region and the substrate.

12. The semiconductor structure of claim 11, wherein the transition layer is compositionally-graded.

13. The semiconductor structure of claim 1, wherein the electrode-defining layer is a passivating layer.

14. The semiconductor structure of claim 1, wherein the electrode-defining layer comprises a silicon nitride compound.

15. The semiconductor structure of claim 1, wherein the electrode-defining layer comprises a silicon oxide compound.

16. The semiconductor structure of claim 1, wherein the electrode-defining layer is formed directly on the gallium nitride material region.

17. The semiconductor structure of claim 1, wherein the electrode extends over a portion of a top surface of the electrode-defining layer.

18. The semiconductor structure of claim 3, wherein the gate electrode extends over a portion of the top surface of the electrode-defining layer a distance, in a direction of the drain electrode, of between about 2% and about 60% of a distance between the gate electrode and the drain electrode.

19. The semiconductor structure of claim 1, wherein the ratio of the electrode length to a cross-sectional dimension at the top of the via is between about 0.50 and 0.95.

20. The semiconductor structure of claim 1, wherein the ratio of the electrode length to a cross-sectional dimension at the top of the via is between about 0.75 and 0.90.

21. The semiconductor structure of claim 1, wherein sidewalls of the electrode-defining layer that define the via are concave-up in relation to the gallium nitride material region.

22. The semiconductor structure of claim 1, wherein the cross-sectional area of the via decreases continuously from the top of the via to the bottom of the via.

23. The semiconductor structure of claim 1, wherein the electrode is in direct contact with the gallium nitride material region across the entire electrode length.

24. The semiconductor structure of claim 1, wherein the electrode comprises a first metal component and a second metal component.

25. The semiconductor structure of claim 24, wherein the first metal component of the electrode is in direct contact with the gallium nitride material region across the entire electrode length and the second metal component of the electrode is not in direct contact with the gallium nitride material region across any portion of the electrode length.

26. The semiconductor structure of claim 23, wherein across the electrode length, the electrode has a constant composition in direct contact with the gallium nitride material region.

27. The semiconductor structure of claim 1, wherein the gate electrode completely fills the via.

28. The semiconductor structure of claim 1, wherein the gallium nitride material region has a crack level of less than 0.005 micron/micron$^2$.

29. The semiconductor structure of claim 1, wherein the gallium nitride material region includes more than one gallium nitride material layers.

30. The semiconductor structure of claim 1, wherein the gallium nitride material region includes a gallium nitride layer.

31. The semiconductor structure of claim 1, wherein the via extends from a top surface of the electrode-defining layer to a bottom surface of the electrode-defining layer.

32. The semiconductor structure of claim 1, wherein the via extends only a portion of the distance between a top surface of the electrode-defining layer and a bottom surface of the passivating layer.

33. The semiconductor structure of claim 1, further comprising at least one layer formed between the electrode-defining layer and the gallium nitride material region.

34. The semiconductor structure of claim 33, further comprising a passivating layer formed between the electrode-defining layer and the gallium nitride material region.

35. The semiconductor structure of claim 1, wherein the electrode is a Schottky contact.

36. A transistor comprising:
 a gallium nitride material region;
 an electrode-defining layer formed on the gallium nitride material region and including a via formed therein, a cross-sectional area of the via being greater at a top of the via than at a bottom of the via, wherein a sidewall of the via extends upward from the bottom of the via at an angle between about 5 degrees and about 85 degrees and downward from the top of the via at an angle between about 90 degrees and about 160 degrees;
 a source electrode formed on the gallium nitride material region;
 a drain electrode formed on the gallium nitride material region; and
 a gate electrode formed on the gallium nitride material region and in the via, wherein a length of the gate electrode is defined at the bottom of the via and the ratio of the gate electrode length to a cross-sectional dimension at the top of the via is between about 0.50 and 0.95, a portion of the gate electrode being in direct contact with the gallium nitride material region and the electrode-defining layer extending, at least, from the gate electrode to the source electrode.

37. The transistor of claim 36, wherein the sidewall of the electrode-defining layer extends upward from a bottom surface of the electrode-defining layer at an angle between about 10 degrees and about 60 degrees.

38. The transistor of claim 36, wherein the sidewall of the electrode-defining layer, extends downward from a top surface of the electrode-defining layer at an angle between about 90 degrees and about 132 degrees.

39. The transistor of claim 36, further comprising a substrate, wherein the gallium nitride material region is formed on the substrate.

40. The transistor of claim 39, wherein the substrate is silicon.

41. The transistor of claim 40, further comprising a compositionally-graded transition layer formed between the gallium nitride material region and the substrate.

42. The transistor of claim 36, wherein the electrode-defining layer is a passivating layer.

43. The transistor of claim 36, wherein the electrode-defining layer is formed direcily on the gallium nitride material region.

44. The transistor of claim 36, wherein the gate electrode extends over a portion of a top surface of the electrode-defining layer a distance, in a direction of the drain electrode, of between about 2% and about 60% of a distance between the gate electrode and the drain electrode.

45. The transistor of claim 36, wherein the gate electrode extends over a portion of the top surface of the electrode-defining layer a distance, in a direction of the source electrode, of less than 50% the distance the gate electrode extends over the electrode-defining layer in the direction of the drain electrode.

46. The transistor of claim 36, wherein the ratio of the electrode length to a cross-sectional dimension at the top of the via is between about 0.75 and 0.90.

47. The transistor of claim 36, wherein sidewalls of the electrode-defining layer that define the via are concave-up in relation to the gallium nitride material region.

48. The transistor of claim 36, wherein the electrode comprises a first metal component and a second metal component.

49. The transistor of claim 48, wherein the first metal component of the electrode is in direct contact with the gallium nitride material region across the entire gate length and the second metal component of the electrode is not in direct contact with the gallium nitride material region across any portion of the gate length.

50. The transistor of claim 36, wherein the gate electrode completely fills the via.

51. The transistor of claim 36, wherein the gallium nitride material region has a crack level of less than 0.005 micron/micron$^2$.

52. The transistor of claim 36, wherein the via extends from a top surface of the electrode-defining layer to a bottom surface of the electrode-defining layer.

53. A semiconductor structure comprising:
a gallium nitride material region;
an electrode-defining layer formed over the gallium nitride material region and including a via formed therein, a cross-sectional area at a top of the via being greater than a cross-sectional area at a bottom of the via;
a gate electrode formed on the gallium nitride material region and in the via, wherein the electrode length is defined at the bottom of the via;
a source electrode formed on the gallium nitride material region; and
a drain electrode formed on the gallium nitride material region,
wherein the gate electrode extends over a portion of the top surface of the electrode-defining layer a distance, in a direction of the drain electrode, of between about 2% and about 60% of a distance between the gate electrode and the drain electrode and the gate electrode extends over a portion of the top surface of the electrode-defining layer a distance in a direction of the drain electrode greater than a distance in a direction of the source electrode.

54. The semiconductor structure of claim 53, wherein the gate electrode extends over a portion of the top surface of the electrode-defining layer a distance, in a direction of the source electrode, of less than 50% the distance the gate electrode extends over the electrode-defining layer in the direction of the drain electrode.

55. The semiconductor structure of claim 53, further comprising a silicon substrate, wherein the gallium nitride material region is formed on the silicon substrate.

56. The semiconductor structure of claim 55, further comprising a compositionally-graded transition layer formed between the gallium nitride material region and the silicon substrate.

57. The semiconductor structure of claim 53, wherein the gallium nitride material region has a crack level of less than 0.005 micron/micron$^2$.

58. A semiconductor structure comprising:
a gallium nitride material region;
an electrode-defining layer formed over the gallium nitride material region and including a via formed therein, a cross-sectional area at a top of the via being greater than a cross-sectional area at a bottom of the via; and
an electrode formed on the gallium nitride material region and in the via, wherein the electrode length is defined at the bottom of the via, the electrode comprising a nickel component and a gold component, the nickel component being in direct contact with the gallium nitride material region across the entire electrode length and the gold component not being in direct contact with the gallium nitride material region across any portion of the electrode length.

59. The semiconductor structure of claim 58, further comprising a silicon substrate, wherein the gallium nitride material region is formed on the silicon substrate.

60. The semiconductor structure of claim 59, further comprising a compositionally-graded transition layer formed between the gallium nitride material region and the silicon substrate.

61. The semiconductor structure of claim 58, wherein the gallium nitride material region has a crack level of less than 0.005 micron/micron$^2$.

62. The semiconductor structure of claim 58, wherein the electrode-defining layer is formed of a nitride-based compound along an entire length of the electrode-defining layer extending from the first electrode to the second electrode.

63. The semiconductor structure of claim 58, wherein the electrode-defining layer is a continuous layer extending from the first electrode to the second electrode.

64. The semiconductor structure of claim 58, wherein the first electrode is a gate electrode and the second electrode is a source electrode and further comprising a drain electrode formed on the gallium nitride material region.

65. The semiconductor structure of claim 58, wherein the gallium nitride material region comprises a gallium nitride material layer having a first composition and the electrode-defining layer is formed on the gallium nitride material layer along an entire length of the electrode-defining layer extending from the first electrode and the second electrode.

66. A transistor comprising:
a gallium nitride material region;
an electrode-defining layer formed on the gallium nitride material region and including a via formed therein, a cross-sectional area of the via being greater at a top of the via than at a bottom of the via, wherein a sidewall of the via extends upward from the bottom of the via at an angle between about 5 degrees and about 85 degrees and downward from the top of the via at an angle between about 90 degrees and about 160 degrees;
a source electrode formed on the gallium nitride material region;
a drain electrode formed on the gallium nitride material region; and
a gate electrode formed on the gallium nitride material region and in the via, wherein a length of the gate electrode is defined at the bottom of the via and the ratio of the gate electrode length to a cross-sectional dimension at the top of the via is between about 0.50 and 0.95, the gate electrode comprising a nickel component and a gold component, the nickel component being in direct contact with the gallium nitride material region across the entire electrode length and the gold component not being in direct contact with the gallium nitride material region across any portion of the electrode length.

67. The semiconductor structure of claim 1, wherein a portion of the electrode-defining layer is formed over a portion of the second electrode.

68. The semiconductor structure of claim 1, wherein the electrode-defining layer passivates the entire surface of the gallium nitride material region extending from the first electrode and the second electrode.

69. The semiconductor structure of claim 1, wherein the electrode-defining layer is formed of a nitride-based compound along an entire length of the electrode-defining layer extending from the first electrode to the second electrode.

70. The semiconductor structure of claim 69, wherein the nitride-based compound is a silicon nitride-based compound.

71. The semiconductor structure of claim 1, wherein the electrode-defining layer is a continuous layer extending from the first electrode to the second electrode.

72. The semiconductor structure of claim 1, wherein the gallium nitride material region comprises a gallium nitride material layer having a first composition and the electrode-defining layer is formed on the gallium nitride material layer along an entire length of the electrode-defining layer extending from the first electrode and the second electrode.

* * * * *

UNITED STATES PATENT AND TRADEMARK OFFICE
CERTIFICATE OF CORRECTION

| | |
|---|---|
| PATENT NO. | : 7,071,498 B2 |
| APPLICATION NO. | : 10/740376 |
| DATED | : July 4, 2006 |
| INVENTOR(S) | : Jerry Wayne Johnson et al. |

It is certified that error appears in the above-identified patent and that said Letters Patent is hereby corrected as shown below:

Column 4, lines 18, 45 and 49, please replace "PET" with --FET--;

Claim 38, line 19, please replace "132 degrees" with --135 degrees--; and

Claim 43, line 31, please replace "direcily" with --directly--.

Signed and Sealed this

Twelfth Day of December, 2006

JON W. DUDAS
*Director of the United States Patent and Trademark Office*